US011088465B2

(12) United States Patent
Elsallal et al.

(10) Patent No.: US 11,088,465 B2
(45) Date of Patent: Aug. 10, 2021

(54) SUBSTRATE-LOADED FREQUENCY-SCALED ULTRA-WIDE SPECTRUM ELEMENT

(71) Applicants: The MITRE Corporation, McLean, VA (US); The Government of the United States of America, as Represented by the Secretary of the Navy, Arlington, VA (US)

(72) Inventors: Wajih Elsallal, Acton, MA (US); Jamie Hood, Owatonna, MN (US); Al Locker, Westford, MA (US); Rick W. Kindt, Arlington, VA (US)

(73) Assignees: The MITRE Corporation, McLean, VA (US); The Government of the United States of America, as Represented by the Secretary of the Navy, Arlington, VA (US)

( * ) Notice: Subject to any disclaimer, the term of this patent is extended or adjusted under 35 U.S.C. 154(b) by 186 days.

(21) Appl. No.: 16/057,672

(22) Filed: Aug. 7, 2018

(65) Prior Publication Data

US 2018/0366836 A1 Dec. 20, 2018

Related U.S. Application Data

(62) Division of application No. 14/544,935, filed on Jun. 16, 2015, now Pat. No. 10,056,699.

(51) Int. Cl.
*H01Q 21/06* (2006.01)
*H01Q 5/25* (2015.01)
(Continued)

(52) U.S. Cl.
CPC ............. *H01Q 21/061* (2013.01); *H01Q 1/48* (2013.01); *H01Q 5/25* (2015.01); *H01Q 21/064* (2013.01); *H01Q 21/24* (2013.01)

(58) Field of Classification Search
CPC .... H01Q 21/061; H01Q 21/064; H01Q 21/24; H01Q 5/25; H01Q 1/48
(Continued)

(56) References Cited

U.S. PATENT DOCUMENTS 4,574,331 A 3/1986 Smolley
5,187,489 A 2/1993 Whelan et al.
(Continued)

FOREIGN PATENT DOCUMENTS

EP 2629367 8/2013
KR 1020160072358 6/2016
(Continued)

OTHER PUBLICATIONS

International Search Report and Written Opinion dated Dec. 14, 2018, directed to PCT Application No. PCT/US2018/051591; 16 pages.

(Continued)

*Primary Examiner* — Frank J McGue
(74) *Attorney, Agent, or Firm* — Morrison & Foerster LLP

(57) ABSTRACT

A unit cell of for a phased array antenna includes a base plate, a first dielectric layer projecting from the base plate, and a first conductive layer disposed on a side of the first dielectric layer, the first conductive layer includes a ground pillar, a first ground member spaced apart from a first edge of the ground pillar, and a first signal member disposed between the ground pillar and the first ground member, wherein: the first signal member is electrically insulated from the ground pillar and the first ground member, and an edge of the first signal member is configured to capacitively couple to the first edge of the ground pillar.

7 Claims, 14 Drawing Sheets

(51) Int. Cl.
*H01Q 1/48* (2006.01)
*H01Q 21/24* (2006.01)

(58) Field of Classification Search
USPC .................................................... 252/62.3 R
See application file for complete search history.

(56) References Cited

U.S. PATENT DOCUMENTS

| | | | | |
|---|---|---|---|---|
| 5,309,165 | A | 5/1994 | Segal et al. | |
| 5,557,291 | A | 9/1996 | Chu et al. | |
| 5,845,391 | A | 12/1998 | Bellus et al. | |
| 5,886,671 | A | 3/1999 | Riemer et al. | |
| 5,923,289 | A | 7/1999 | Buer et al. | |
| 5,945,897 | A | 8/1999 | Pluymers et al. | |
| 5,982,250 | A * | 11/1999 | Hung | H01L 23/49822 333/26 |
| 6,020,848 | A | 2/2000 | Wallace et al. | |
| 6,297,774 | B1 | 10/2001 | Chung | |
| 6,300,906 | B1 | 10/2001 | Rawnick et al. | |
| 6,424,313 | B1 | 7/2002 | Navarro et al. | |
| 6,480,154 | B1 | 11/2002 | Bella et al. | |
| 6,529,166 | B2 | 3/2003 | Kanamaluru | |
| 6,531,976 | B1 | 3/2003 | Yu | |
| 6,552,687 | B1 | 4/2003 | Rawnick et al. | |
| 6,552,691 | B2 | 4/2003 | Mohuchy et al. | |
| 6,771,221 | B2 | 8/2004 | Rawnick et al. | |
| 6,822,616 | B2 | 11/2004 | Durham et al. | |
| 6,856,297 | B1 | 2/2005 | Durham et al. | |
| 6,876,336 | B2 | 4/2005 | Croswell et al. | |
| 7,009,570 | B2 | 3/2006 | Durham et al. | |
| 7,034,753 | B1 | 4/2006 | Elsallal et al. | |
| 7,088,300 | B2 | 8/2006 | Fisher | |
| 7,109,939 | B2 | 9/2006 | Lynch et al. | |
| 7,180,457 | B2 | 2/2007 | Trott et al. | |
| 7,260,141 | B2 | 8/2007 | Bierly et al. | |
| 7,369,083 | B2 | 5/2008 | Budic | |
| 7,373,127 | B2 | 5/2008 | Reed | |
| 7,385,914 | B2 | 6/2008 | Choi et al. | |
| 7,394,424 | B1 | 7/2008 | Jelinek et al. | |
| 7,403,169 | B2 | 7/2008 | Svensson et al. | |
| 7,408,520 | B2 | 8/2008 | Durham et al. | |
| 7,474,262 | B2 | 1/2009 | Alland | |
| 7,714,782 | B2 | 5/2010 | Davis et al. | |
| 7,760,142 | B2 | 7/2010 | Sabet et al. | |
| 8,081,123 | B2 | 12/2011 | Yang | |
| 8,154,469 | B2 | 4/2012 | McKinley et al. | |
| 8,305,283 | B2 | 11/2012 | Bourtoutian | |
| 8,325,093 | B2 | 12/2012 | Holland et al. | |
| 8,350,773 | B1 | 1/2013 | Kindt | |
| 8,405,564 | B2 | 3/2013 | Kindt et al. | |
| 8,466,846 | B1 | 6/2013 | Elsallal et al. | |
| 8,482,475 | B2 | 7/2013 | Tiezzi et al. | |
| 8,547,275 | B2 | 10/2013 | Culkin et al. | |
| 8,643,554 | B1 | 2/2014 | Manry, Jr. et al. | |
| 8,665,845 | B2 | 3/2014 | O'Keeffe et al. | |
| 8,736,504 | B1 | 5/2014 | West et al. | |
| 8,749,446 | B2 | 6/2014 | Manry, Jr. et al. | |
| 8,754,810 | B2 | 6/2014 | Guo et al. | |
| 8,847,836 | B2 | 9/2014 | Yu et al. | |
| 8,872,719 | B2 | 10/2014 | Warnick | |
| 8,941,540 | B2 | 1/2015 | Harper et al. | |
| 8,947,312 | B2 | 2/2015 | Brown et al. | |
| 8,988,278 | B2 | 3/2015 | Lee et al. | |
| 9,070,972 | B2 | 6/2015 | Wang et al. | |
| 9,190,727 | B1 | 11/2015 | Urcia et al. | |
| 9,445,282 | B2 | 9/2016 | Chen et al. | |
| 9,912,072 | B1 | 3/2018 | Mandeville et al. | |
| 2005/0035915 | A1 | 2/2005 | Livingston et al. | |
| 2008/0012710 | A1 | 1/2008 | Sadr | |
| 2008/0211726 | A1* | 9/2008 | Elsallal | H01Q 13/08 343/770 |
| 2009/0239551 | A1 | 9/2009 | Woodsum | |
| 2010/0007572 | A1 | 1/2010 | Jones et al. | |
| 2010/0154250 | A1 | 6/2010 | Bae et al. | |
| 2010/0277385 | A1 | 11/2010 | Lewis et al. | |
| 2011/0057852 | A1 | 3/2011 | Holland et al. | |
| 2012/0025370 | A1* | 2/2012 | Wholey | H01L 23/4824 257/737 |
| 2012/0194406 | A1 | 8/2012 | Brown et al. | |
| 2013/0016003 | A1 | 1/2013 | Stirling-Gallacher et al. | |
| 2013/0207878 | A1 | 8/2013 | Mital et al. | |
| 2013/0342397 | A1 | 12/2013 | Turbiner | |
| 2014/0138546 | A1 | 5/2014 | Iluz et al. | |
| 2014/0152510 | A1 | 6/2014 | Manry, Jr. et al. | |
| 2014/0266897 | A1 | 9/2014 | Jakoby et al. | |
| 2014/0327576 | A1 | 11/2014 | Kumar | |
| 2015/0295309 | A1* | 10/2015 | Manry, Jr. | H01Q 1/48 342/374 |
| 2015/0364819 | A1 | 12/2015 | Ngo et al. | |
| 2016/0087111 | A1 | 3/2016 | Toonen et al. | |
| 2016/0164587 | A1 | 6/2016 | Pu et al. | |
| 2016/0241323 | A1 | 8/2016 | Ko et al. | |
| 2017/0025767 | A1 | 1/2017 | Elsallal et al. | |
| 2017/0237177 | A1* | 8/2017 | Kirino | H01Q 13/24 343/745 |
| 2017/0302003 | A1 | 10/2017 | Elsallal et al. | |
| 2018/0269592 | A1 | 9/2018 | Elsallal et al. | |
| 2018/0269593 | A1 | 9/2018 | Elsallal et al. | |
| 2018/0375217 | A1 | 12/2018 | Elsallal et al. | |
| 2019/0089068 | A1 | 3/2019 | Franzlni et al. | |
| 2020/0076090 | A1 | 3/2020 | Franzini et al. | |
| 2020/0212041 | A1* | 7/2020 | Machkaoutsan | H01L 27/10805 |
| 2021/0036736 | A1* | 2/2021 | Uchimura | H01Q 1/24 |

FOREIGN PATENT DOCUMENTS

| | | | |
|---|---|---|---|
| WO | 1999-034477 | | 7/1999 |
| WO | 2001089030 | A1 | 11/2001 |
| WO | 2015-019100 | | 2/2015 |
| WO | 2015104728 | A1 | 7/2015 |

OTHER PUBLICATIONS

Jamil, K. et al. (2012) "A Multi-Band Multi-Beam Software-Defined Passive Radar Part I: System Design," IET International Conference on Radar Systems (Radar 2012); 4 pages.

Odile, Adrian (2008) "From AESA radar to digital radar for surface applications," IET, Waveform Diversity & Digital Radar Conference—Day 2: From Active Modules to Digital Radar, retrieved at http://ieeexplore.ieee.org/document/4782200/?arnumber=4782200, abstract only; 1 page.

Volakis, John L. et al. (2014) "Ultra-wideband conformal apertures with digital beamforming for UHF to millimeter-wave applications," IEEE International Workshop on Antenna Technology: Small Antennas, Novel EM Structures and Materials, and Applications (iWAT); retrieved at http://ieeexplore.ieee.org/document/6958622, abstract only; 1 page.

Zhao, Yun et al., (2014) "Wideband and Low-Profile H-Plane Ridged SIW Horn Antenna Mounted on a Large Conducting Plane," IEEE Transactions on Antennas and Propagation (vol. 62, Issue 11, retrieved at http://ieeexplore.ieee.org/document/6891293, abstract only; 1 page.

Franzini et al., U.S. Office Action dated Feb. 21, 2020, directed to U.S. Appl. No. 15/708,035; 9 pages.

Franzini et al., U.S. Office Action dated Mar. 18, 2020, directed to U.S. Appl. No. 16/115,306; 18 pages.

Franzini et al., U.S. Office Action dated Oct. 29, 2019, directed to U.S. Appl. No. 15/708,035; 7 pages.

Boryssenko, Anatoliy et al., "Substrate Free G-Band Vivaldi Antenna Array Design, Fabrication and Testing," 39th International Conference on Infrared, Millimeter, and Terahertz Waves (IRMMW-THz), Sep. 2014, 2 pages.

Elsallal et al. U.S. Office Action dated Oct. 26, 2017, directed to U.S. Appl. No. 14/544,935; 7 pages.

Elsallal et al. U.S. Office Action dated Sep. 8, 2017, directed to U.S. Appl. No. 14/544,934; 6 pages.

Elsallal et al., U.S. Office Action dated Jul. 13, 2018, directed to U.S. Appl. No. 15/986,464; 6 pages.

(56) References Cited

OTHER PUBLICATIONS

Elsallal et al., U.S. Office Action dated Jul. 17, 2018, directed to U.S. Appl. No. 15/986,413; 9 pages.
Fenn, Alan J. et al., "The Development of Phased-Array Radar Technology," Lincoln Laboratory Journal, vol. 12, No. 2, (2000), pp. 321-340.
Galli, A. et al., "Novel Printed UWB Array Based on a Versatile and Low-Cost Antenna Configuration," 6th European Conference on Antennas and Propagation, IEEE, 2011, pp. 626-628.
Holland, Steven S. et al., "A 7-21 GHz Dual-Polarized Planar Ultrawideband Modular Antenna (PUMA) Array," IEEE Transactions on Antennas and Propagation, vol. 60, No. 10, Oct. 2012, pp. 4589-4600.
Moulder, William F. et al., "Ultrawideband Superstrate-Enhanced Substrate-Loaded Array With Integrated Feed," IEEE Transactions on Antennas and Propagation, vol. 61, No. 11, Nov. 2013, pp. 5802-5807.
Shen, W. et al., "Study on Asymmetric Tapered Slotline Antenna," IEEE 2006, pp. 156-158.
Tallini, D. et al., "A New Low-Profile Wide-Scan Phased Array for UWB Applications," 2007; 5 pages.
Yao, Y. et al. "Ultra-wideband Antenna Array Using Novel Asymmetric Tapered Slot Radiator," IEEE 2008; 4 pages.
Yi, Huan et al. "3-D Printed Discrete Dielectric Lens Antenna with Matching Layer," Proceedings of ISAP 2014, Kaohsiung, Taiwan, Dec. 2, 2014, pp. 115-116.

* cited by examiner

SUBSTRATE-LOADED FREQUENCY-SCALED ULTRA-WIDE SPECTRUM ELEMENT

CROSS-REFERENCE TO RELATED APPLICATIONS

This application is a divisional application of U.S. application Ser. No. 14/544,935, filed Jun. 16, 2015, and is related to U.S. application Ser. No. 14/544,934, "Frequency-Scaled Ultra-Wide Spectrum Element," filed Jun. 16, 2015, which are incorporated herein by reference in their entirety.

STATEMENT REGARDING FEDERALLY SPONSORED RESEARCH OR DEVELOPMENT

This invention was made with Government support under U.S. Government Contract No. W15P7T-13-C-A802 awarded by the U.S. Department of the Army. The Government has certain rights in this invention.

FIELD OF THE INVENTION

The present disclosure relates generally to antenna arrays, and more specifically to ultra-wideband, single and phased array antennas.

BACKGROUND OF THE INVENTION

There are increasing demands to develop a wideband phased array or electronically scanned array (ESA) that include a wide variety of configurations for various applications, such as satellite communications (SATCOM), radar, remote sensing, direction finding, and other systems. The goal is to provide more flexibility and functionality at reduced cost with consideration to limited space, weight, and power consumption (SWaP) on modern military and commercial platforms. This requires advances in ESA and manufacturing technologies.

A phased array antenna is an array of antenna elements in which the phases of respective signals feeding the antenna elements are set in such a way that the effective radiation pattern of the array is reinforced in a desired direction and suppressed in undesired directions, thus forming a beam. The relative amplitudes of constructive and destructive interference effects among the signals radiated by the individual elements determine the effective radiation pattern of the phased array. The number of antenna elements in a phased array antenna is often dependent on the required gain of a particular application and can range from dozens to tens of thousands or more.

Phased array antennas for ultra-wide bandwidth (more than one octave bandwidth) performance are often large, causing excessive size, weight, and cost for applications requiring many elements. The excessive size of an array may be required to accommodate "electrically large" radiating elements (several wavelengths in length), increasing the total depth of the array. Arrays may also be large due to the nesting of several multi-band elements to enable instantaneous ultra-wide bandwidth performance, which increases the total length and width of the array.

Phased arrays antennas have several primary performance characteristics in addition to the minimization of grating lobes, including bandwidth, scan volume, and polarization. Grating lobes are secondary areas of high transmission/reception sensitivity that appear along with the main beam of the phased array antenna. Grating lobes negatively impact a phased array antenna by dividing transmitted/received power into a main beam and false beams, creating ambiguous directional information relative to the main beam and generally limiting the beam steering performance of the antenna. Bandwidth is the frequency range over which an antenna provides useful match and gain. Scan volume refers to the range of angles, beginning at broadside (normal to the array plane) over which phasing of the relative element excitations can steer the beam without generating grating lobes. Polarization refers to the orientation or alignment of the electric field radiated by the array. Polarization may be linear (a fixed orientation), circular (a specific superposition of polarizations), and other states in between.

Phased array antenna design parameters such as antenna element size and spacing affect these performance characteristics, but the optimization of the parameters for the maximization of one characteristic may negatively impact another. For example, maximum scan volume (maximum set of grating lobe-free beam steering angles) may be set by the antenna element spacing relative to the wavelength at the high end of the frequency spectrum. Once cell spacing is determined, a desired minimum frequency can be achieved (maximizing bandwidth) by increasing the antenna element length to allow for impedance matching. However, increased element length may negatively influence polarization and scan volume. The scan volume can be increased through closer spacing of the antenna elements, but closer spacing can increase undesirable coupling between elements, thereby degrading performance. This undesirable coupling can change rapidly as the frequency varies, making it difficult to maintain a wide bandwidth.

Existing wide bandwidth phased array antenna elements are often large and require contiguous electrical and mechanical connections between adjacent elements (such as the traditional Vivaldi). In the last few years, there have been several new low-profile wideband phased array solutions, but many suffer from significant limitations. For example, planar interleaved spiral arrays are limited to circular polarization. Tightly coupled printed dipoles require superstrate materials to match the array at wide-scan angles, which adds height, weight, and cost. The Balanced Antipodal Vivaldi Antenna (BAVA) requires connectors to deliver the signal from the front-end electronics to the aperture.

Existing designs often have not been able to maximize phased array antenna performance characteristics such as bandwidth, scan volume, and polarization without sacrificing size, weight, cost, and/or manufacturability. Accordingly, there is a need for a phased array antenna with wide bandwidth, wide scan volume, and good polarization, in a low cost, lightweight, small footprint (small aperture) design that can be scaled for different applications.

BRIEF SUMMARY OF THE INVENTION

In accordance with some embodiments, a frequency scaled ultra-wide spectrum phased array antenna includes a pattern of unit cells of radiating elements and pillars formed into a metallic layers sandwiched between substrate layers. Each radiating element includes a signal ear and a ground ear. Radiating elements are configured to be electromagnetically coupled to one or more adjacent radiating elements via the pillars. The unit cells are scalable and may be combined into an array of any dimension to meet desired antenna performance. Embodiments can provide good impedance over ultra-wide bandwidth, wide scan angle, and good polarization, in a low cost, lightweight, small aperture design that is easy to manufacture.

Phased array antennas, according to some embodiments, may reduce the number of antennas which need to be implemented in a given application by providing a single antenna that serves multiple systems. In reducing the number of required antennas, embodiments of the present invention may provide a smaller size, lighter weight, lower cost, reduced aperture alternative to conventional, multiple-antenna systems.

According to certain embodiments, a phased array antenna includes a base plate and a board projecting from the base plate. The board comprises a dielectric layer and a conductive layer, wherein the conductive layer comprises first and second spaced apart radiating elements and a pillar disposed between the first and second spaced apart radiating elements. The pillar is electrically connected to the base plate, and the first and second spaced apart radiating elements are configured to capacitively couple to the pillar.

According to certain embodiments, the phased array antenna is configured to transmit or detect RF signals over a bandwidth of at least 2:1. According to certain embodiments, the antenna is configured to have an average voltage standing wave ratio of less than 5:1. According to certain embodiments, the antenna is configured to have an average voltage standing wave ratio of less than 5:1 over a scan volume of at least 30 degrees from broadside.

According to certain embodiments, a unit cell of for a phased array antenna includes a base plate, a first dielectric layer projecting from the base plate, and a first conductive layer disposed on a side of the first dielectric layer. The first conductive layer includes a ground pillar, a first ground member spaced apart from a first edge of the ground pillar, and a first signal member disposed between the ground pillar and the first ground member. The first signal member is electrically insulated from the ground pillar and the first ground member and an edge of the first signal member is configured to capacitively couple to the first edge of the ground pillar.

According to certain embodiments, the conductive layer further comprises a second ground member spaced apart from a second edge of the ground pillar, opposite the first edge, wherein an edge of the second ground member is configured to capacitively couple to the second edge of the ground pillar.

According to certain embodiments, a unit cell further includes a second dielectric layer, a second conductive layer disposed on a side of the second dielectric layer, the second conductive layer comprises: a second signal member spaced apart from a third edge of the ground pillar, wherein the second signal member is electrically insulated from the base plate and the ground pillar, and an edge of the second signal member is configured to capacitively couple to the third edge of the ground pillar; and a third ground member spaced apart from a fourth edge of the ground pillar, opposite the third edge, wherein an edge of the third ground member is configured to capacitively couple to the fourth edge of the ground pillar.

According to certain embodiments, the element is configured to receive RF signals in a frequency range between a first frequency and a second frequency that is higher than the first frequency and the first signal member projects from the base plate with a maximum height of one-half the wavelength of the second frequency.

According to certain embodiments, the ground pillar comprises a first plurality of projections that project from the first edge of the ground pillar; and the first signal member comprises a second plurality of projections that project from the edge of the first signal member.

According to certain embodiments, the ground pillar and the first ground member are configured to be electrically connected to a base plate. According to certain embodiments, a distal end of the first ground member and a distal end of the first signal member are substantially symmetrical about a plane disposed midway between the first ground member and the first signal member.

According to certain embodiments, a radiating element for a phased array antenna comprises a first dielectric layer; a first conductive layer disposed on a first side of the first dielectric layer, the first conductive layer comprising: a first member comprising a first stem and a first impedance matching portion, wherein the first impedance matching portion comprises at least one projecting portion projecting from a first edge of the first impedance matching portion; and a second member spaced apart from the first member, the second member comprising a second impedance matching portion, wherein the second impedance matching portion comprises at least one other projecting portion projecting toward the first edge of the first impedance matching portion.

According to certain embodiments, the first member further comprises a first capacitive coupling portion along a second edge, opposite the first edge, the first capacitive coupling portion configured to capacitively couple to a first ground pillar.

According to certain embodiments, the first impedance matching portion and the second impedance matching portion are substantially symmetrical.

According to certain embodiments, the first impedance matching portion comprises a first projecting portion at an end of the first member, the first projecting portion projecting from the first edge of the first impedance matching portion, and a second projecting portion spaced between the first projecting portion and the first stem, the second projecting portion projecting from the first edge of the first impedance matching portion, and wherein the first projecting portion projects farther than the second projecting portion.

According to certain embodiments, the first member is electrically insulated from the second member.

According to certain embodiments, a radiating element includes a second conductive layer disposed on a second side of the first dielectric layer, the second conductive layer comprising a ground strip, wherein at least a portion of the ground strip and at least a portion of the first stem form a microstrip or a stripline.

According to certain embodiments, a radiating element includes a second conductive layer disposed on a second side of the first dielectric layer, the second conductive layer comprising a first ground strip, a second dielectric layer disposed on a side of the first conductive layer opposite the first dielectric layer; and a third conductive layer disposed on a side of the second dielectric layer, the third conductive layer comprising a second ground strip, wherein the first ground strip and the second ground strip are electrically connected to the second member.

DETAILED DESCRIPTION OF THE INVENTION

Figure 1:
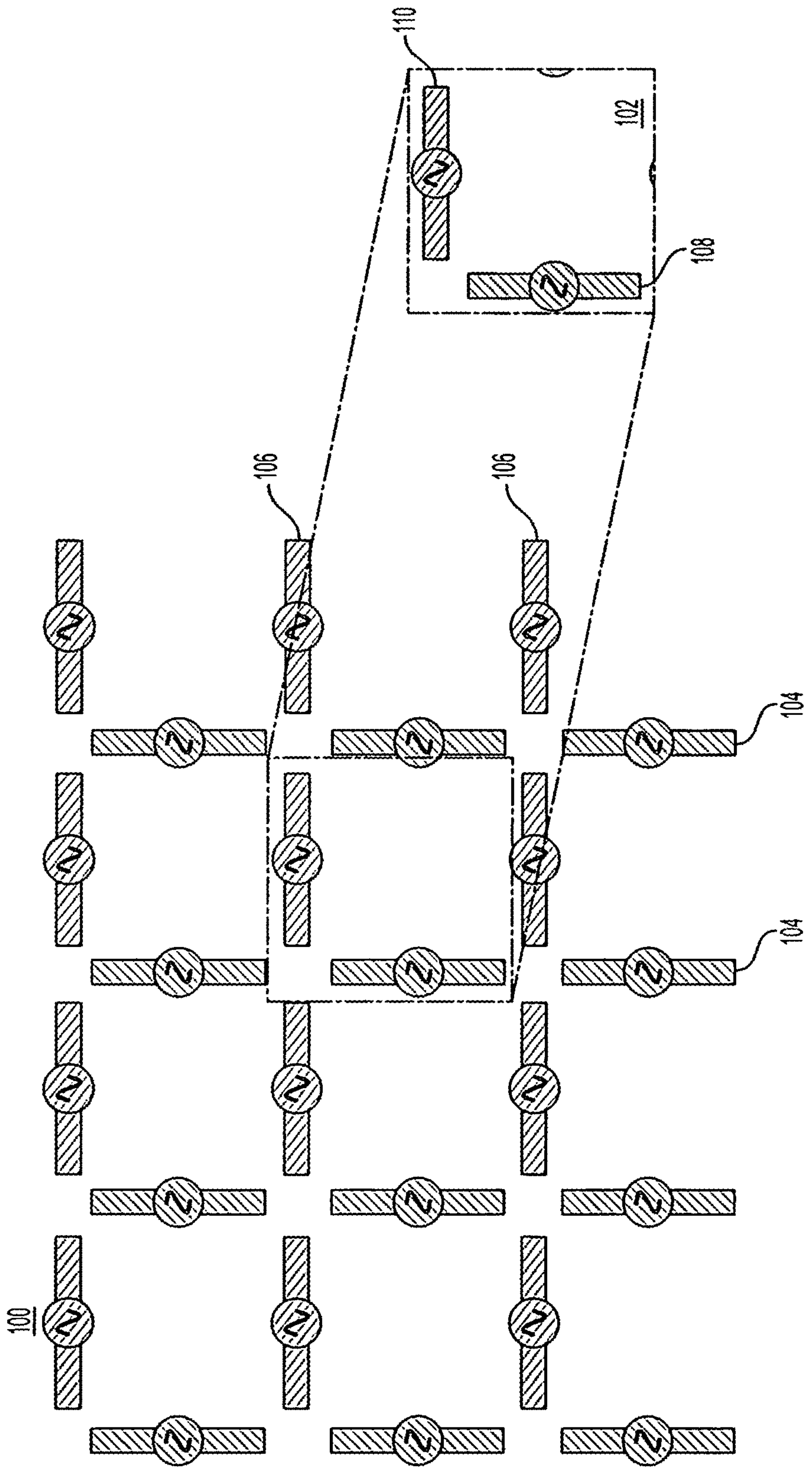
FIG. 1 is a plan view of a dual-polarized phased array antenna according to certain embodiments.

In the following description of the disclosure and embodiments, reference is made to the accompanying drawings in which are shown, by way of illustration, specific embodiments that can be practiced. It is to be understood that other embodiments and examples can be practiced and changes can be made without departing from the scope of the disclosure.

In addition, it is also to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units, but do not preclude the presence or addition of one or more other features, integers, steps, operations, elements, components, units, and/or groups thereof.

Reference is sometimes made herein to an array antenna having a particular array shape (e.g. a planar array). One of ordinary skill in the art will appreciate that the techniques described herein are applicable to various sizes and shapes of array antennas. It should thus be noted that although the description provided herein describes the concepts in the context of a rectangular array antenna, those of ordinary skill in the art will appreciate that the concepts equally apply to other sizes and shapes of array antennas including, but not limited to, arbitrary shaped planar array antennas as well as cylindrical, conical, spherical and arbitrary shaped conformal array antennas.

Reference is also made herein to the array antenna including radiating elements of a particular size and shape. For example, certain embodiments of radiating element are described having a shape and a size compatible with operation over a particular frequency range (e.g. 2-30 GHz). Those of ordinary skill in the art will recognize that other shapes of antenna elements may also be used and that the size of one or more radiating elements may be selected for operation over any frequency range in the RF frequency range (e.g. any frequency in the range from below 20 MHz to above 50 GHz).

Reference is sometimes made herein to generation of an antenna beam having a particular shape or beam-width. Those of ordinary skill in the art will appreciate that antenna beams having other shapes and widths may also be used and may be provided using known techniques such as by inclusion of amplitude and phase adjustment circuits into appropriate locations in an antenna feed circuit.

Described herein are embodiments of frequency-scaled ultra-wide spectrum phased array antennas. These phased array antennas are formed of repeating cells of frequency-scaled ultra-wide spectrum radiating elements. Phased array antennas according to certain embodiments exhibit wide bandwidth, low cross-polarization, and high scan-volume while being low cost, small aperture, and scalable.

A unit cell of a frequency-scaled ultra-wide spectrum phased array antenna, according to certain embodiments, consists of a pattern of radiating elements. According to certain embodiments, the radiating elements are formed of interlacing substrate-based components that include a pair of ears formed into metal layers on the substrates, which forms coplanar transmission lines. One of the ears is the ground component of the radiating element and can be terminated to the ground of a connector used for connecting a feed line or directly to the array's baseplate. The other ear is the signal or active line of the radiating element and can be connected to the feed conductor of a feed line. According to certain embodiments, the edge of the radiating elements (the edge of the ears) are shaped to interweave with metallic pillars that are included in the metal layers formed on the substrates, which controls the capacitive component of the antenna and can allow good impedance matching at the low-frequency end of the bandwidth, effectively increasing the operational bandwidth. This has the advantage of a phased array antenna in which no wideband impedance matching network or special mitigation to a ground plane is needed. Radiating elements can be for transmit, receive, or both. Phased array antennas can be built as single polarized or dual polarized arrays by implementing the appropriate radiating element pattern, as described below.

FIG. 1 illustrates an antenna with an array 100 of radiating elements according to certain embodiments. A dual polarized configuration is shown with radiating elements 106 oriented horizontally and radiating elements 104 oriented vertically. In this embodiment, a unit cell 102 includes a single horizontally polarized element 110 and a single vertically polarized element 108. Array 100 is a 4×3 array of unit cells 102. According to certain embodiments, array 100 can be scaled up or down to meet design requirements such as antenna gain. According to certain embodiments, modular arrays of a predefined size may be combined into a desired configuration to create an antenna array to meet required performance. For example, a module may consist of the 4×3 array of radiating elements 100 illustrated in FIG. 1. A particular antenna application requiring 96 radiating elements can be built using eight modules fitted together (thus, providing the 96 radiating elements). This modularity allows for antenna arrays to be tailored to specific design requirements at a lower cost.

As shown in FIG. 1, element 108 is disposed along a first axis and element 110 is disposed along a second axis, such that element 108 is substantially orthogonal to element 110. This orthogonal orientation results in each unit cell 102 being able to generate orthogonally directed electric field polarizations. That is, by disposing one set of elements (e.g. vertical elements 104) in one polarization direction and disposing a second set of elements (e.g. horizontal elements 106) in the orthogonal polarization direction, an antenna which can generate signals having any polarization is provided. In this particular example, unit cells 102 are disposed in a regular pattern, which here corresponds to a square grid pattern. One of ordinary skill in the art will appreciate that unit cells 102 need not all be disposed in a regular pattern. In some applications, it may be desirable or necessary to dispose unit cells 102 in such a way that elements 108 and 110 of each unit cell 102 are not aligned between every unit cell 102. Thus, although shown as a square lattice of unit cells 102, it will be appreciated by those of ordinary skill in the art, that antenna 100 could include, but is not limited to, a rectangular or triangular lattice of unit cells and that each of the unit cells can be rotated at different angles with respect to the lattice pattern.

Figure 2C:
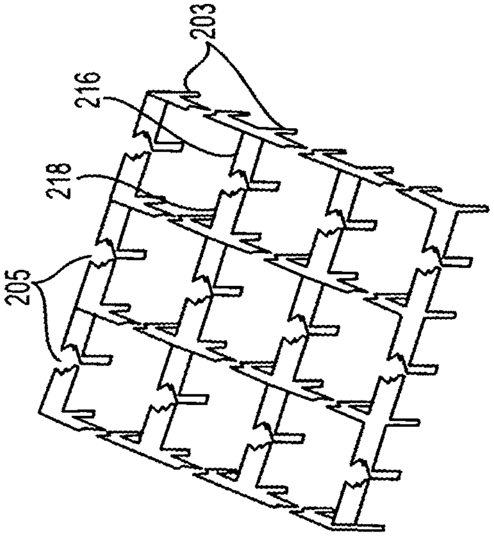
FIG. 2C is an isometric view of the metal layers of a dual-polarized phased array antenna according to certain embodiments.
Figure 2B:
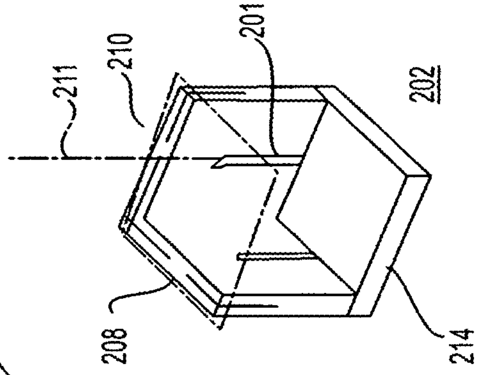
FIG. 2B is an isometric view of a unit cell of dual-polarized phased array antenna according to certain embodiments.
Figure 2A:
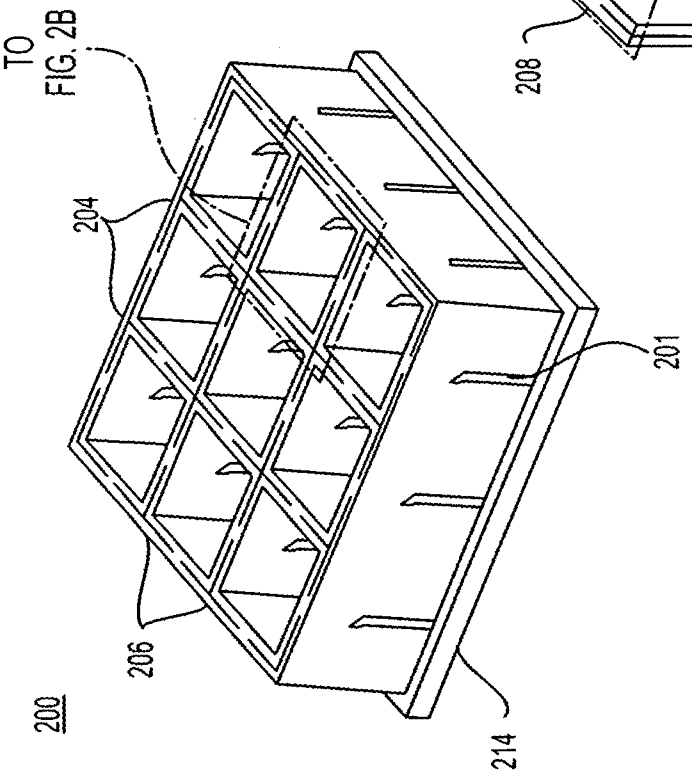
FIG. 2A is an isometric view of a dual-polarized phased array antenna according to certain embodiments.

An array of radiating elements 200 according to certain embodiments is illustrated in FIGS. 2A, 2B, and 2C. Array 200 is a dual-polarized configuration with multiple columns of radiating elements 204 oriented along a first polarization axis (referred to herein as vertically polarized) and multiple rows of radiating elements 206 oriented along a second polarization axis (referred to herein as horizontally polarized) all affixed to base plate 214, which forms the ground plane of array 200. FIG. 2B illustrates a unit cell 202 for a dual-polarized phased array according to certain embodiments. Any number of unit cells may be connected to build a single-polarized (linear) or dual-polarized (planar) array.

Array 200 includes a plurality of interlocking parallel and perpendicular boards. Each board includes a center metal layer sandwiched between two dielectric layers. Metal traces 201 may be formed on the outer faces of the dielectric layers. FIG. 2C is an illustrative view of the center metal layers of array 200 with the dielectric layers hidden. Radiating elements 205 and ground pillars 203 are formed into the center metal layer of the respective board. Each radiating element includes a ground ear and a signal ear. For example, unit cell 202 (see FIG. 2B) includes two radiating elements, a vertically polarized radiating element 208 and a horizontally polarized radiating element 210. Horizontally polarized radiating element 210 includes a signal ear 216 and ground ear 218. A signal beam is generated by exciting radiating element 210, i.e. by generating a voltage differential between signal ear 216 and ground ear 218. The generated signal beam has a direction along the centerline 211 of radiating element 210, perpendicular to base plate 214. Centerline 211 is the phase center of radiating element 210. A beam generated by a radiating element may have an orientation that is generally within the plane of the radiating element. Because the planes of radiating element 208 and 210 are perpendicular, their respective beams will be generally perpendicular. As illustrated in the embodiments of FIGS. 2A-2C, the phase centers of radiating elements 204 are not co-located with the phase centers of radiating elements 206.

In the embodiments of FIGS. 2A-2C, the radiating elements 204 are of the same size, shape, and spacing as radiating elements 206. However, phased array antennas, according to other embodiments, may include only single polarized radiating elements (e.g., only rows of radiating elements 206). According to some embodiments, the spacing of one set of radiating elements (e.g., the horizontally polarized elements 206) is different from the spacing of the other set of radiating elements (e.g., the vertically polarized elements 204). According to some embodiments, the radiating element spacing within a row may not be uniform. For example, the spacing between first and second elements within a row may be different than the spacing between the second and third elements.

Figure 3A:
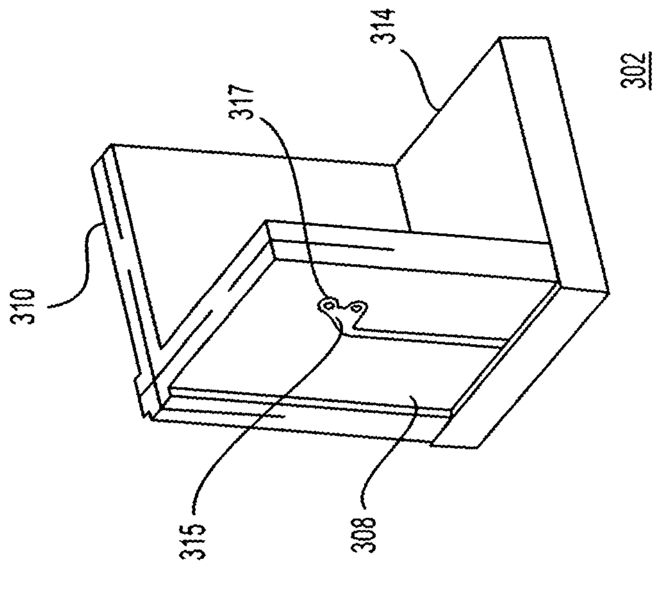
FIG. 3A is an isometric view of a unit cell of a dual-polarized phased array antenna according to certain embodiments.
Figure 3B:
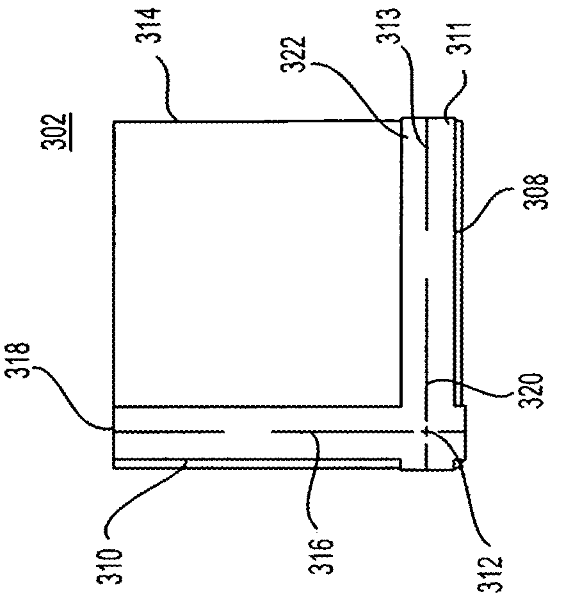
FIG. 3B is an top view of a unit cell of a dual-polarized phased array antenna according to certain embodiments.

FIGS. 3A and 3B are isometric and top views, respectively, of unit cell 302, according to certain embodiments. Radiating element 308 includes signal ear 320 and ground ear 322 formed into a metal layer sandwiched between dielectric layers 311 and 313. Pillar 312 is also formed in the metal layer. Pillar 312 and ground ear 322 may be electrically coupled to base plate 314, which forms the ground plane of the antenna, such that no (or minimal) electrical potential is generated between them during operation. According to certain embodiments, pillar 312 and ground ear 322 are not electrically coupled to base plate 314 but instead to a separate ground circuit. Dielectric layer 311 and includes metal trace 315 on its outer face. Metal trace 315 can be electrically coupled to base plate 314 (the ground plane of the antenna) and to ground ear 322 through vias 317, also known as TSVs (Through Substrate Vias), that project through each substrate layer to the central metallized layer. According to some embodiments, dielectric layer 313 also includes a metal trace on its outer face that may be electrically coupled to base plate 314 or a separate ground circuit and is electrically coupled to ground ear 322 and metal trace 315 through vias 317. Signal ear 320 is electrically isolated (insulated) from base plate 314, pillar 312, and ground ear 322.

According to some embodiments, a second radiating element 310 is disposed along a second, orthogonal axis. Radiating element 310 includes signal ear 316 and ground ear 318. Pillar 312 and ground ear 318 may be both electrically coupled to base plate 314 such that no (or minimal) electrical potential is generated between them during operation. According to certain embodiments, pillar 312 and ground ear 318 are not electrically connected to base plate 314 but instead to a separate ground circuit. Signal ear 316 is electrically isolated (insulated) from base plate 314, pillar 312, and ground ear 318.

Figure 4:
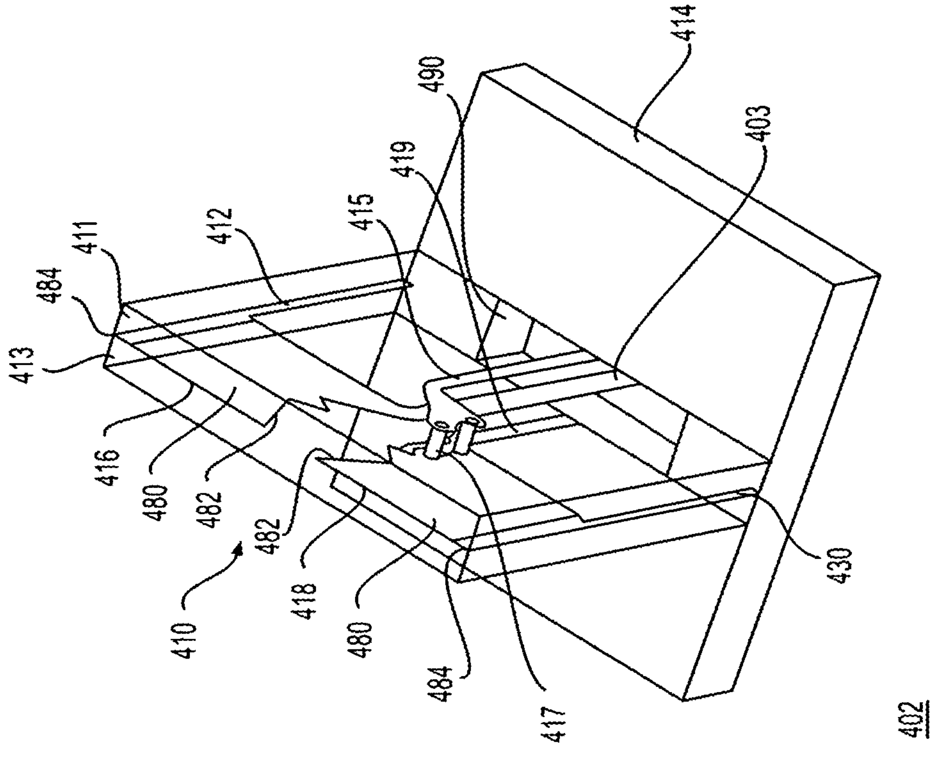
FIG. 4 is an isometric view of a unit cell of a single-polarized phased array antenna according to certain embodiments.

FIG. 4 illustrates metal layers of a single-polarized unit cell 402 according to some embodiments. Radiating element 410 includes signal ear 416, ground ear 418, first ground pillar 412, and second ground pillar 430. Signal ear 416 includes a stem portion 403 that connects to the signal conductor of a transmission line. Ground ear 418 is connected through one or more vias 417 to ground trace 415 formed on the external side of first dielectric layer 411 and ground trace 419 formed on the external side of second dielectric layer 413. Stem portion 403 of signal ear 416 and ground traces 415 and 419 can form a stripline feed structure for feeding signals to radiating element 410. Generally, as well known in the art, a stripline is a conductor sandwiched by dielectric between a pair of ground planes.

According to some embodiments, stem portion 403 of signal ear 416 forms the conductor of the stripline and ground traces 415 and 419 form the ground planes of the stripline. According to certain embodiments, stem portion 403 and ground trace 415 and 419 directly overlap. According to certain embodiments, ground trace 415 and 419 are of substantially equivalent width to the stem portion of signal ear 416, and in other embodiments, ground trace 415 and 419 are narrower or wider than the stem portion of the signal ear. According to some embodiments, instead of two ground traces (one on each external side), only one ground trace is used, forming a microstrip feed structure. Generally, as well known in the art, a microstrip feed structure includes a conductive strip and a ground plane, separated by a dielectric layer. According to some embodiments, the stem portion of the signal ear forms the conductor of the microstrip and a single ground trace forms the ground plane.

Figure 5B:
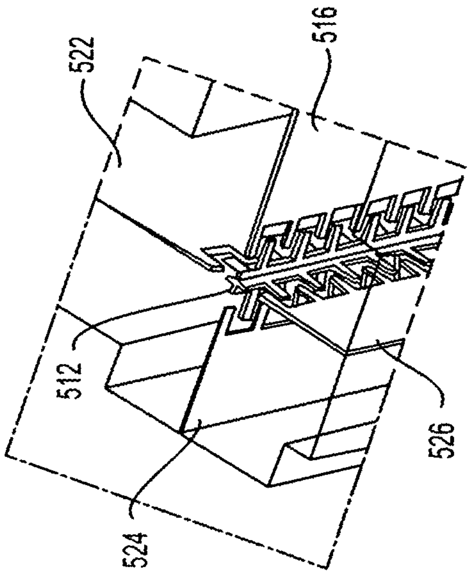
FIG. 5B is an enlarged isometric view of the metal layers of a unit cell of a dual-polarized phased array antenna according to certain embodiments.
Figure 5C:
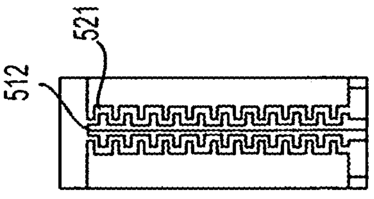
FIG. 5C is an enlarged cross-sectional view of a the metal layers of a pillar according to certain embodiments.
Figure 5A:
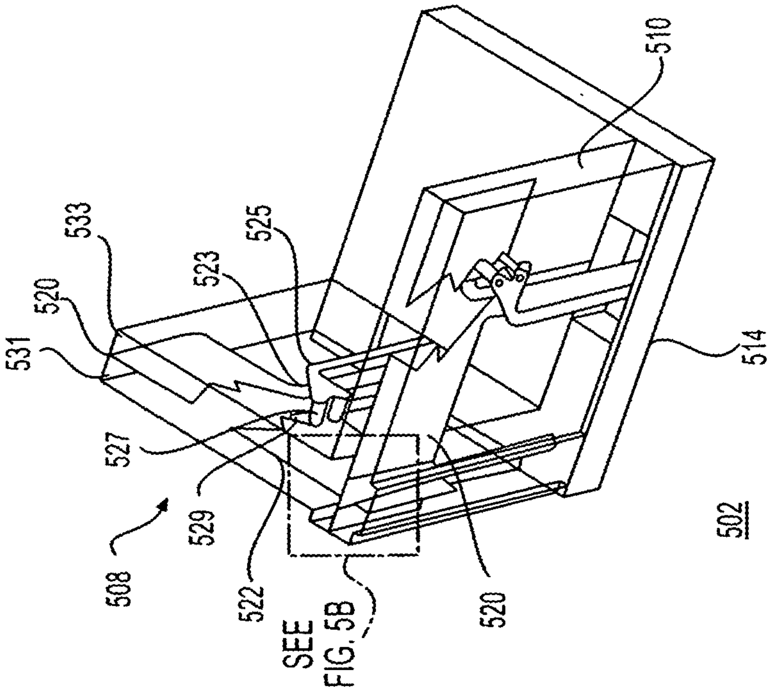
FIG. 5A is an isometric view of a the metal layers of a unit cell of a dual-polarized phased array antenna according to certain embodiments.

FIG. 5A illustrates metal layers of a dual-polarized unit cell 502 according to some embodiments. In addition to radiating element 510, which is similar in structure to radiating element 410 of FIG. 4, unit cell 502 includes radiating element 508. Radiating element 508 includes signal ear 520 and ground ear 522. Signal ear 520 includes a stem portion 523 that connects to the signal conductor of a transmission line. Ground ear 522 is connected through one or more vias 527 to ground trace 525 formed on the external side of first dielectric layer 531 and ground trace 529 formed on the external side of second dielectric layer 533. Stem portion 523 of signal ear 520 and ground traces 525 and 529 can form a strip line feed structure for feeding signals to radiating element 510. According to certain embodiments, stem portion 503 and ground trace 525 and 529 directly overlap. According to certain embodiments, ground trace 525 and 529 are of substantially equivalent width to the stem portion of signal ear 520, and in other embodiments, the ground traces are narrower or wider than the stem portion of the signal ear. According to some embodiments, instead of two ground traces (one on each external side), only one ground trace is used, forming a microstrip feed structure.

FIG. 5B is a close-up view of ground pillar 512 and FIG. 5C is a cross sectional view of the intersection between the radiating elements and ground pillar 512. The edges of the radiating elements (the edge of the ears) include fingers projecting along an edge that are shaped to interweave with corresponding fingers on ground pillar 512 to capacitively couple adjacent radiating elements to the ground plane during operation. This can enhance the capacitive component of the antenna, which allows a good impedance match at the low-frequency end of the bandwidth. Through this capacitive coupling of pillar 512, each radiating element in a row or column can be electromagnetically coupled to ground and the previous and next radiating element in the row or column.

Capacitive coupling is achieved by maintaining a gap 521 between a radiating element ear and its adjacent pillar, which creates interdigitated capacitance between the two opposing edges of gap 521. The interdigitated capacitance created by gap 521 can be used to improve the impedance matching of the radiating element. Maximum capacitive coupling can be achieved by maximizing the surface area of gap 521 while minimizing the width of gap 521. Signal ear 520 and ground ear 522 include fingers the project from the sides to interlace with fingers of the adjacent pillar (such as pillar 512 for signal ear 520) in order to maximize the capacitive coupling surface area. According to certain embodiments, gap 521 is less than 0.01 inches, preferably less than 0.005 inches, and more preferably less than 0.001 inches.

Interdigitated capacitance enables capacitive coupling of a first radiating element to the ground plane and the next radiating element in the row (or column). In other words, the electromagnetic field from a first radiating element communicates from its ground ear across the adjacent gap to the adjacent ground pillar through the interdigitated capacitance and then across the opposite gap to the adjacent signal ear of the next radiating element. Referring to FIG. 5B, pillar 512 is surrounded by four radiating element ears. On the right side is signal ear 516 of radiating element 510. On the left side is the ground ear 524 of the next radiating element along that axis. On the top side is ground ear 522 of radiating element 508. On the bottom side is the signal ear 526 of the next radiating element along that axis. Capacitive coupling between pillar 512 and each ear 516 and 524 created by adjacent gaps 521 enable the electromagnetic field of radiating element 508 to couple to the electromagnetic field of the next radiating element (the radiating element of ground ear 524), and capacitive coupling between pillar 512 and each ear 522 and 526 created by respective adjacent gaps 521 enable the electromagnetic field of radiating element 510 to couple to the electromagnetic field of the next radiating element (the radiating element that includes signal ear 526).

It should be understood that the illustrations of unit cell 502 in 5A and 5B truncate ground ears 524 and 526 on the left and bottom side of pillar 512 for illustrative purposes only. One of ordinary skill in the art would understand that the relative orientation of one set of radiating elements to an orthogonal set of radiating elements, as described herein, is readily modified, i.e. a signal ear could be on the left side of pillar 512 with a ground ear being on the right side, and/or a signal ear could be on the bottom side of pillar 512 with a ground ear being on the top side (relative to the view of FIG. 3C).

Figure 6:
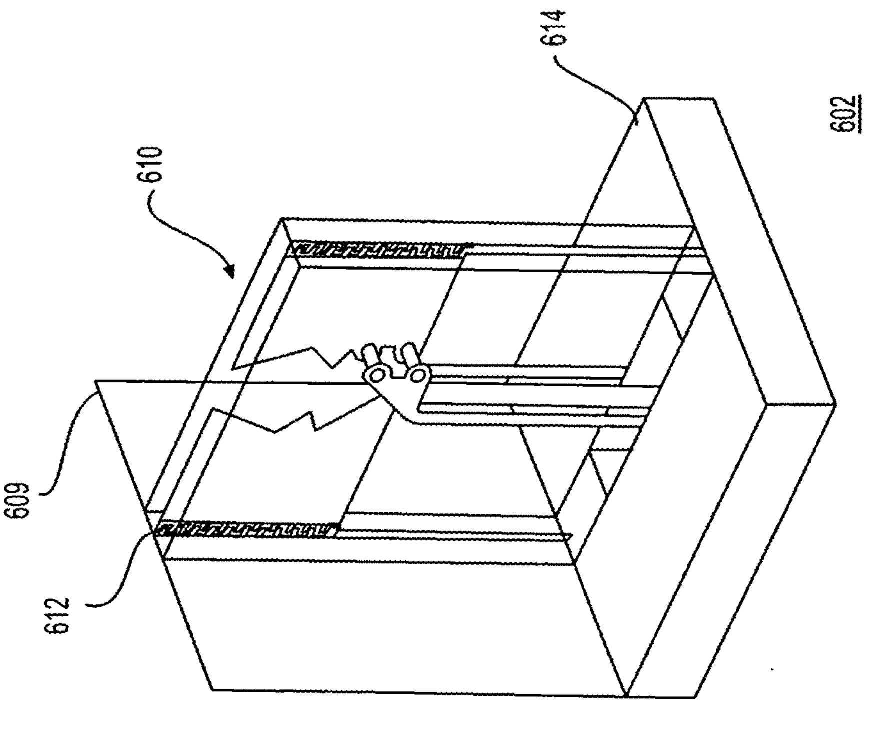
FIG. 6 is an isometric view of a the metal layers of a unit cell of a single-polarized phased array antenna according to certain embodiments.

According to certain embodiments, a single-polarized array includes unit cell 602 shown in FIG. 6. Orthogonal to radiating element 610 is a metal fin 609 that is electrically coupled to base plate 614 and pillar 612. The inclusion of the metallized layer can reduce signal anomalies that may appear at certain frequencies.

According to some embodiments, such as those describes with respect to FIGS. 2A-6, the base plate is formed from one or more conductive materials, such as metals like aluminum, copper, gold, silver, beryllium copper, brass, and various steel alloys. According to certain embodiments, the base plate is formed from a non-conductive material such as various plastics, including Acrylonitrile butadiene styrene (ABS), Nylon, Polyamides (PA), Polybutylene terephthalate (PBT), Polycarbonates (PC), Polyetheretherketone (PEEK), Polyetherketone (PEK), Polyethylene terephthalate (PET), Polyimides, Polyoxymethylene plastic (POM/Acetal), Polyphenylene sulfide (PPS), Polyphenylene oxide (PPO), Polysulphone (PSU), Polytetrafluoroethylene (PTFE/Teflon), or Ultra-high-molecular-weight polyethylene (UHMWPE/UHMW), that is plated or coated with a conductive material such as gold, silver, copper, or nickel. According to certain embodiments, the base plate is a solid block of material with holes, slots, or cut-outs for inserting boards containing radiating elements. In other embodiments, the base plate includes cutouts to reduce weight.

The base plate may be manufactured in various ways including machined, cast, or molded. In some embodiments, holes or cut-outs in the base plate may be created by milling, drilling, formed by wire EDM, or formed into the cast or mold used to create the base plate. The base plate can provide structural support for each radiating element and pillar and provide overall structural support for the array or module. The base plate may be of various thicknesses depending on the design requirements of a particular application. For example, an array or module of thousands of radiating elements may include a base plate that is thicker than the base plate of an array or module of a few hundred elements in order to provide the required structural rigidity for the larger dimensioned array. According to certain embodiments, the base plate is less than 6 inches thick. According to certain embodiments, the base plate is less than 3 inches thick, less than 1 inch thick, less than 0.5 inches thick, less than 0.25 inches thick, or less than 0.1 inches thick. According to certain embodiments, the base plate is between 0.2 and 0.3 inches thick. According to some embodiments, the thickness of the base plate may be scaled with frequency (for example, as a function of the wavelength of the highest designed frequency, λ). For example, the thickness of the base plate may be less than 1.0λ, 0.5λ, or less than 0.25λ. According to some embodiments, the thickness of the base plate is greater than 0.1λ, greater than 0.25λ, greater than 0.5λ, or greater than 1.0λ.

According to certain embodiments, the base plate is designed to be modular and includes features in the ends that can mate with adjoining modules. Such interfaces can provide both structural rigidity and cross-interface conductivity. Modules may be various sizes incorporating various numbers of unit cells of radiating elements. According to certain embodiments, a module is a single unit cell. According to certain embodiments, modules are several unit cells (e.g., 2×2, 4×4), dozens of unit cells (e.g., 5×5, 6×8), hundreds of unit cells (e.g., 10×10, 20×20), thousands of unit cells (e.g., 50×50, 100×100), tens of thousands of unit cells (e.g., 200×200, 400×400), or more. According to certain embodiments, a module is rectangular rather than square (i.e., more cells along one axis than along the other).

According to certain embodiments, modules align along the centerline of a radiating element such that a first module ends with a ground pillar and the next module begins with a ground pillar. The base plate of the first module may include partial cutouts along its edge to mate with partial cutouts along the edge of the next module to form a receptacle to receive the radiating elements that fit between the ground pillars along the edges of the two modules. According to certain embodiments, the base plate of a module extends further past the last set of ground pillars along one edge than it does along the opposite edge in order to incorporate a last set of receptacles used to receive the set of radiating elements that form the transition between one module and the next. In these embodiments, the receptacles along the perimeter of the array remain empty. According to certain embodiments, a transition strip is used to join modules, with the transition strip incorporating a receptacle for the transition radiating elements. According to certain embodiments, no radiating elements bridge the transition from one module to the next. Arrays formed of modules according to certain embodiments can include various numbers of modules, such as two, four, eight, ten, fifteen, twenty, fifty, a hundred, or more.

According to some embodiments, an array is built by inserting printed circuit boards (PCBs) into the base plate. According to some embodiments, an entire row of radiating elements and pillars are formed into a single PCB in a single process. The radiating elements can be formed by either metal plating or etching away a metal layer on one surface of a first dielectric layer (substrate) to create the desired radiating element and pillar shapes through additive or subtractive processes according to known methods. A second substrate can be bonded to the first substrate such that the metal layer of radiating elements and pillars is sandwiched between the two substrates. On the second sides of one or both of the substrates, ground strips can be either metal plated or etched away. The ground strips can be electrically coupled to the inner layers by forming and metal plating vias through the dielectric layers. According to some embodiments, each substrate is formed of multiple layers of dielectric material.

Figure 7C:
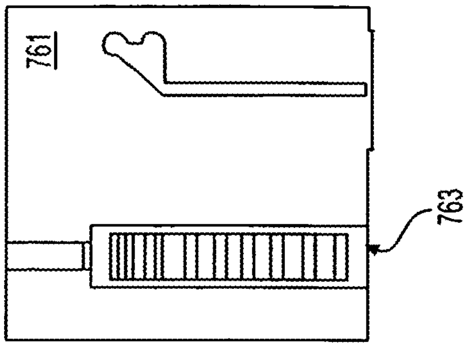
FIG. 7C is a side view of a second polarization of a dual-polarized phased array antenna according to certain embodiments.
Figure 7B:
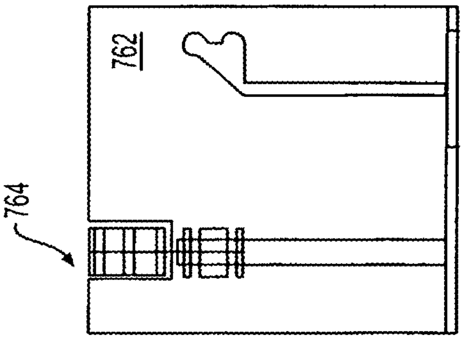
FIG. 7B is a side view of a first polarization of a dual-polarized phased array antenna according to certain embodiments.
Figure 7A:
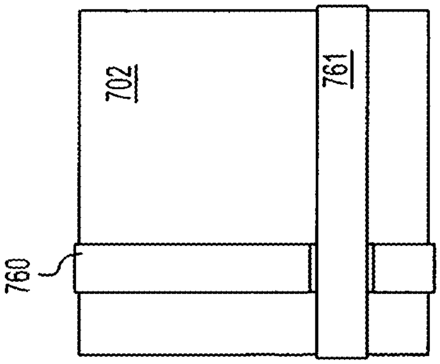
FIG. 7A is a top view of a unit cell of a dual-polarized phased array antenna according to certain embodiments.

Dual polarized arrays, according to some embodiments, require interlocking of perpendicular boards to create a grid structure. According to certain embodiments, rows of horizontally polarized radiating elements interlock with rows of vertically polarized radiating elements by forming opposing vertical slots in the respective boards that enable the boards to interlock. As shown in FIGS. 7A, 7B, and 7C, horizontal board 761 includes slot 763 and vertical board 762 includes slot 764. Slots 763 and 764 are formed at the ground pillar sections of each unit cell 702. Board 761 slides over board 762. The ground pillars are formed from portions of each board at each slot and the assembly of the boards completes the ground pillars.

Figure 8A:
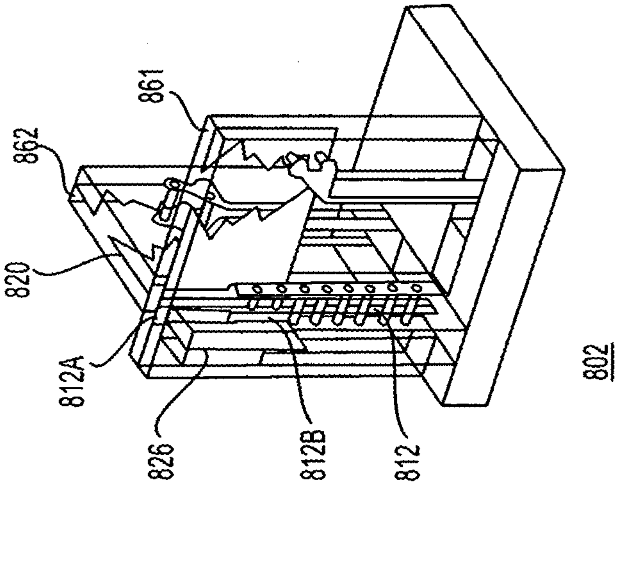
FIG. 8A is an isometric view of a the metal layers of a unit cell of a dual-polarized phased array antenna according to certain embodiments.
Figure 8B:
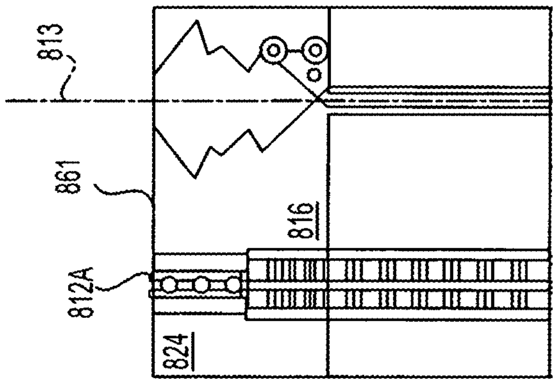
FIG. 8B is a side view of the metal layers a first polarization of a dual-polarized phased array antenna according to certain embodiments.
Figure 8C:
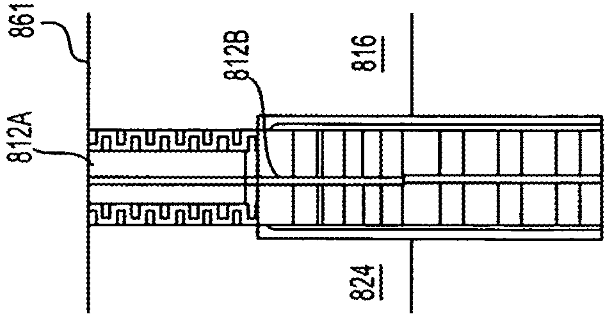
FIG. 8C is an enlarged view of a the metal layers of a pillar according to certain embodiments.

The metal layers of unit cell 802 are shown in FIGS. 8A-8C. A first board 861 includes an upper portion 812A of ground pillar 812 that terminates in a vertical slot that runs from the bottom of board 861. Upper portion 812A includes capacitive coupling fingers that interweave with capacitive coupling fingers of signal ear 816 and ground ear 824. The outer faces of the board are plated with metal strips that generally have a width equivalent to the thickness of the intersecting board 862 and run from the top of board 861 to the top of the vertical slot. Vias are formed into board 861 to electrically couple these metal strips with pillar portion 812A in the inner layer. The edges of the slot are edge plated with a conductive material.

The orthogonal board, board 862, includes a lower portion 812B of ground pillar 812 that terminates in a vertical slot running from the top of board 862. Lower portion 812B includes capacitive coupling fingers that interweave with capacitive coupling fingers of signal ear 820 and ground ear 826. The outer faces of the board are plated with metal strips that generally have a width equivalent to the thickness of the intersecting board 862 and run from the bottom of board 862 to the bottom of the vertical slot. Vias are formed into board 862 to electrically couple these metal strips with pillar portion 812A in the inner layer. The edges of the slot are edge plated with a conductive material.

Boards 861 and 862 are interlocked by sliding one slotted portion onto the other. The edge plating of one slot mates with the ground strips of the other slot such that lower portion 812A and upper portion 812B are electrically coupled, completing pillar 812. A conductive adhesive may be used to bond the assembled boards and increase the electrical coupling. An advantage of this design is that an entire row of radiating elements can be formed from a single PCB for both polarizations and an entire array can be quickly assembled. However, the capacitive coupling between radiating elements and adjacent pillars may be reduced due to the reduction in interdigitated coupling. In other words, each polarization incorporates only half the available space for capacitive coupling (one polarization incorporates the lower half while the other incorporates the upper half).

Figure 9A:
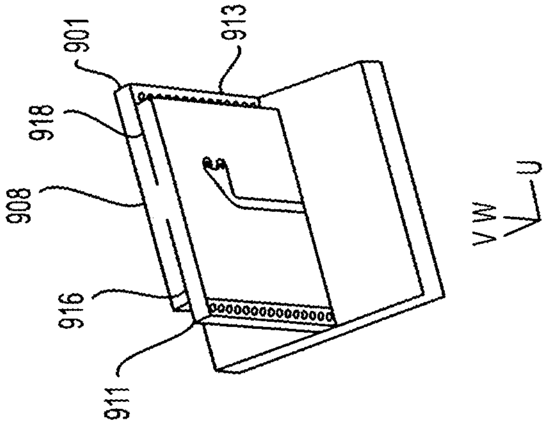
FIG. 9A is an isometric view of a first polarization of a unit cell of a dual-polarized phased array antenna according to certain embodiments.
Figure 9B:
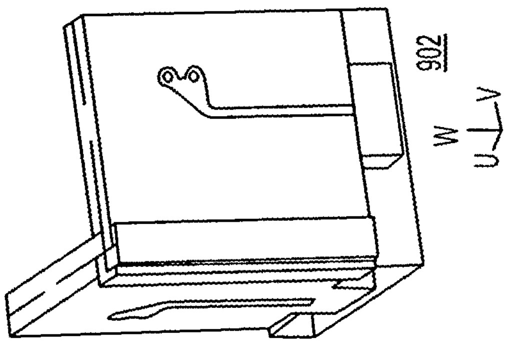
FIG. 9B is a isometric view of a unit cell of a dual-polarized phased array antenna according to certain embodiments.

According to certain embodiments, a dual-polarized array is built element-by-element by assembling individual boards, each of which includes a single radiating element. Each board can also include portions of ground pillars, one on each of its ends. The boards fit together at the ground pillar ends, forming an entire ground pillar. For example, as shown in FIG. 9A, board 901 includes a single radiating element 908 with signal ear 916 and ground ear 918 sandwiched between dielectric layers 911 and 913. Dielectric layer 911 overhangs dielectric layer 913 on one end and dielectric layer 913 overhangs dielectric layer 911 on the opposite end, creating steps on each end. Unit cell 902, shown in FIG. 9B, is assembled by fitting the stepped portions of four radiating element boards together. Each of the stepped portions includes ground pillar features such that when the four boards are fitted together, the ground pillar features are electrically coupled forming ground pillar 912.

Figure 9C:
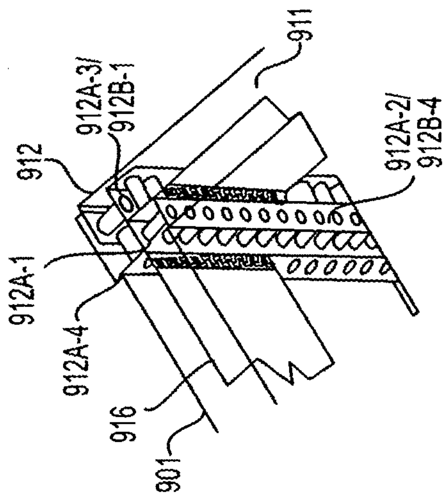
FIG. 9C is an enlarged view of a the metal layers of a pillar according to certain embodiments.

FIG. 9C illustrates the metal layers of unit cell 902. Board 901 includes signal ear 916 in the inner metal layer that includes fingers for coupling with ground pillar 912. Board 901 also includes a ground pillar portion 912A-1, which is a strip in the inner metal layer along the stepped portion that includes fingers for interweaving with the fingers of signal ear 916. Along the outer face of the stepped portion, parallel to ground pillar portion 912A-1, is ground strip 912A-2 that electrically couples with ground pillar portion 912A-1 through vias formed into the stepped portion of board 901. Board 901 is also edge plated forming ground edges 912A-3 and 912A-4.

The other three boards in unit cell 902 include these same features and when the boards are assembled together, the inner strips, outer strips, and edge platings mate together and electrically couple to form ground pillar 912. For example, board 911, which fits orthogonally to board 901, includes ground pillar portion 912B-1, ground strip 912B-2, and ground edges 912B-3 and 912B-4. Upon assembling boards 901 and 911 together, ground strip 912A-2 mates with ground edge 912B-4 and ground edge 912A-3 mates with ground pillar portion 912B-1. According to some embodiments, conductive adhesive is used to join the boards together and provide improved conductivity. An advantage of these embodiments is that the entire capacitive coupling portion of each ear can be capacitively coupled to the ground pillar.

Figure 10A:
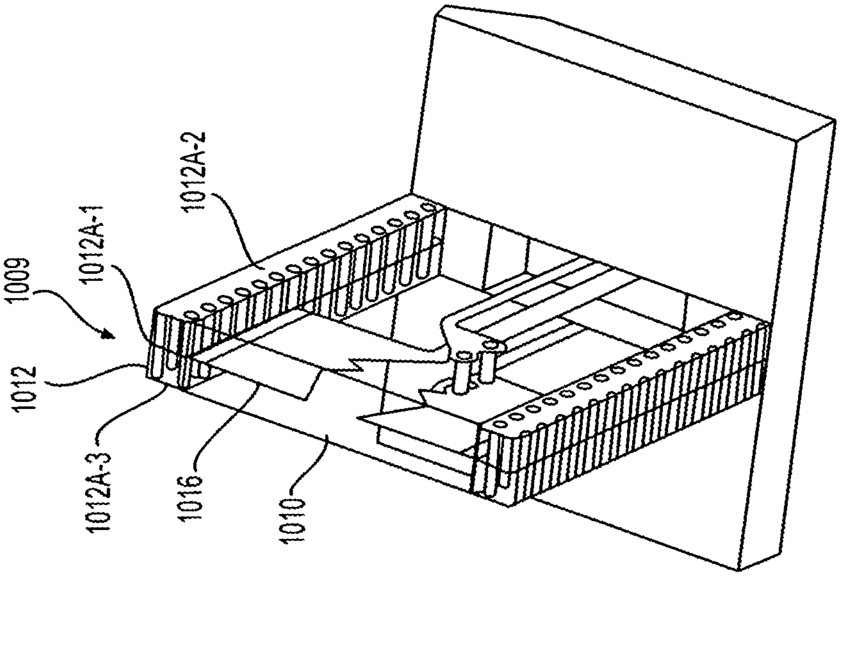
FIG. 10A is an isometric view of the metal layers of a unit cell of a single-polarized phased array antenna according to certain embodiments.
Figure 10B:
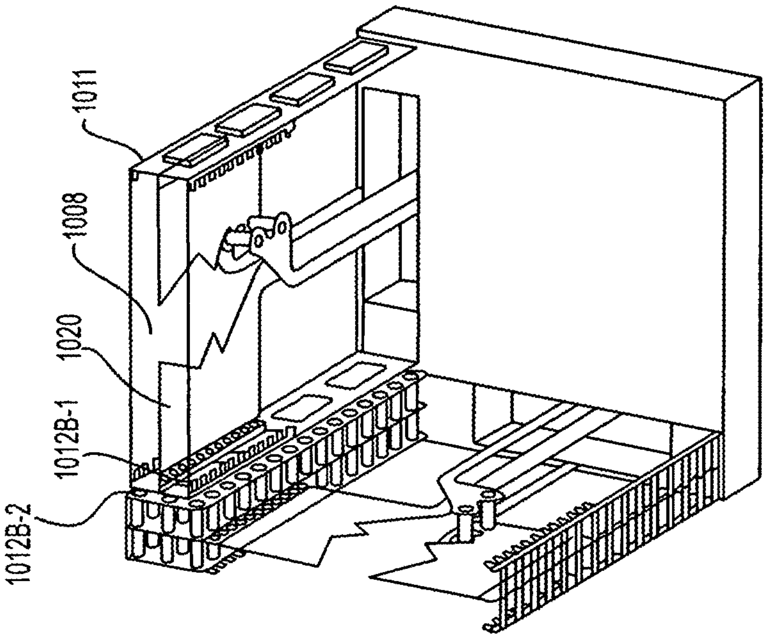
FIG. 10B is a isometric view of the metal layers of a unit cell of a dual-polarized phased array antenna according to certain embodiments.

According to some embodiments, as illustrated in FIGS. 10A and 10B, a first set of radiating elements for a first polarization, including radiating element 1010, are formed into a single board 1001 and a second set of radiating elements for the second polarization, including radiating element 1008, are formed into individual boards 1009 that are then assembled to the first board at the ground pillar portion of the first radiating elements using, for example, an electrically conductive adhesive or solder.

Board 1009 includes signal ear 1016 in the inner metal layer that includes fingers for coupling with ground pillar 1012. The inner metal layer of board 1009 also includes a ground pillar portion 1012A-1, which is a strip of metal that includes a first set of fingers along one edge of the strip for interweaving with the fingers of signal ear 1016 and another set of fingers along the opposite edge for interweaving with the fingers of the ground ear of the next radiating element in the row. Along the outer faces of board 1009, parallel to ground pillar portion 1012A-1, are ground strips 1012A-2 and 1012A-3 that electrically couple with ground pillar portion 1012A-1 through vias formed into board 1009.

Board 1011, which includes radiating element 1008 for the second polarization, includes signal ear 1020 in the inner metal layer that includes fingers for coupling with ground pillar 1012. The inner metal layer of board 1011 also includes a ground pillar portion 1012B-1, which is a strip of metal that includes a set of fingers for interweaving with the fingers of signal ear 1020. Edge 1012B-2 of board 1011 is plated with a metal that electrically couples to ground pillar portion 1012B-1.

Upon assembling boards 1009 and 1011 together, ground strip 1012A-2 mates with ground edge 1012B-2. Similar joining of a board opposite to board 1011 completes the assembly of ground pillar 1012. According to some embodiments, conductive adhesive is used to join the boards together and provide improved conductivity. An advantage of these embodiments is that the entire capacitive coupling portion of each ear can be capacitively coupled to the ground pillar. According to some embodiments, grounds strips 1012A-2 and 1012A-3 are equivalent in width to the thickness of board 1011 to maximize the electrical coupling of boards 1009 and 1011.

Figure 11A:
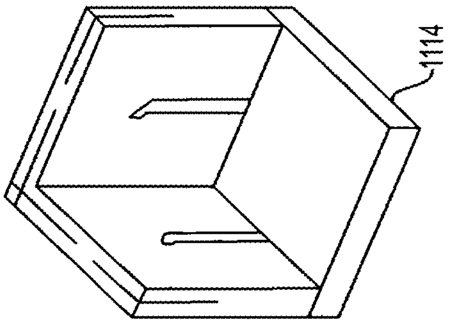
FIG. 11A is an isometric view of a unit cell of a dual-polarized phased array antenna according to certain embodiments.
Figure 11B:
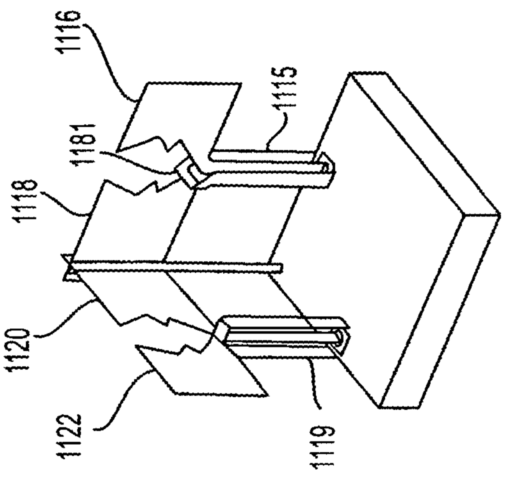
FIG. 11B is an isometric view of a the metal layers of a unit cell of a dual-polarized phased array antenna according to certain embodiments.
Figure 11C:
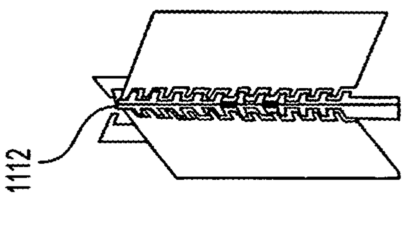
FIG. 11C is an enlarged isometric view of the metal layers of a pillar according to certain embodiments.

According to some embodiments, the phased array antenna may be constructed using a 3D printing process. Traditional manufacturing techniques such as machining or injection molding may produce separate complex parts that may require extensive assembly and manufacture. By using 3D printing, it is possible to fabricate an entire array in a single process. According to some embodiments, as illustrated in FIGS. 11A-11C, base plate 1114, ground pillar 1112, signal ears 1116 and 1120, ground ears 1118 and 1122, and ground traces 1115 and 1119 may be 3D printed as a single unit. According to some embodiments, the base plate may be separately fabricated, for example using the methods described above, and unit cells containing radiating elements and ground pillars are 3D printed as a single grid structure, which is then assembled onto the base plate. According to some embodiments, the unit cells are 3D printed directly on the base plate. According to some embodiments, a single-polarized array can be fabricated by 3D printing rows of single-polarized radiating element unit cells directly onto a pre-fabricated base plate. According to certain embodiments, the base plate and unit cells are 3D printed as a single unit. According to certain embodiments, ribs of dielectric material are formed between rows of radiating elements for support.

According to some embodiments, the dielectric portions of the array can be 3D printed using a thermoplastic such as ABS, PC, PSU, and/or nylon. The metal portions, such as the radiating elements, pillars, ground traces, and ground plane, can be 3D printed from a conductive material such as silver or gold. An array or portions of the array may be fabricated by various 3D printing technologies such as selective laser sintering (SLS), fused deposition modeling (FDM), or stereo lithography (SLA). According to some embodiments, the array may be fabricated with ULTEM, a polyetherimide-based thermoplastic material, by the FDM process.

As illustrated in FIG. 11B, according to some embodiments, band-like layers of conductive material 1181 can connect ground traces 1115 and 1119 to ground ear 1118 and 1122 instead of the vias required for some printed circuit board based embodiments. As illustrated in FIG. 11C, ground pillar 1112 can be 3D printed as a single unit instead of being formed from separate pieces bonded together, as in certain embodiments described above. For example, ground pillar 1112 in FIGS. 11B and 11C can be a continuous piece of metal that incorporates fingers for capacitively coupling to orthogonal radiating elements in a dual-polarized configuration.

Figure 12A:
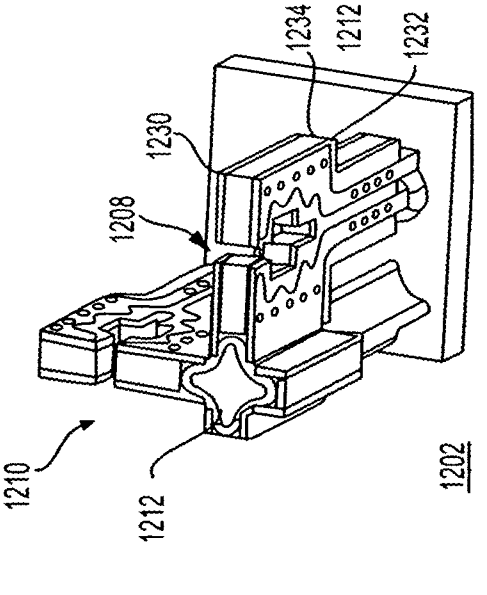
FIG. 12A is an isometric view of a unit cell of a dual-polarized phased array antenna according to certain embodiments.
Figure 12B:
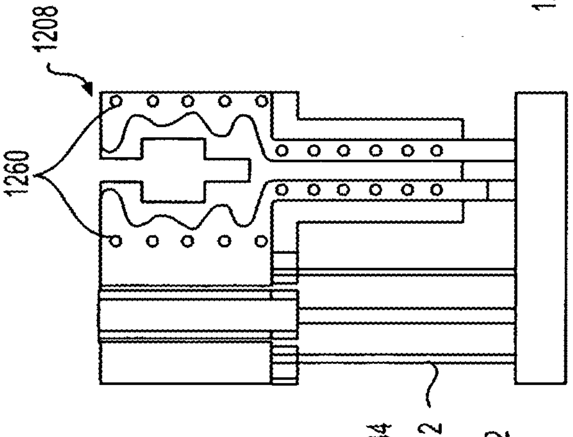
FIG. 12B is a side view of a unit cell of a dual-polarized phased array antenna according to certain embodiments.
Figure 12C:
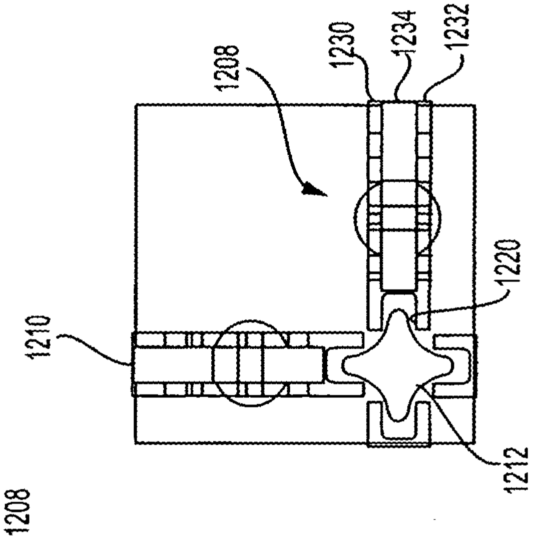
FIG. 12C is a side top view of a unit cell of a dual-polarized phased array antenna according to certain embodiments.

According to certain embodiments, as illustrated in FIGS. 12A-12C, an array of radiating elements includes unit cells 1202 with ground pillars 1212 formed into a block of material instead of formed into a PCB. Each radiating element, 1208 and 1210, is formed from layers of dielectric material (substrates) and layers of metal. The edges of the layered elements are shaped to encapsulate the cross-shaped pillar, which controls the capacitive component of the antenna allowing good impedance matching at the low-frequency end of the operational bandwidth.

According to some embodiments, radiating elements 1208 and 1210 include three layers of substrates. The outer layers (1230 and 1232) project outward to encapsulate pillar 1212, while middle layer 1234 provides thickness for the required spacing between the outer substrates. Radiating element ears are formed into metal layers bonded to the outer faces of the outer substrates (1230 and 1231). The metal layers are electrically connected to each other by forming vias 1260 between the two layers. According to some embodiments, radiating element ears are formed into additional metal layers, such as metal layers formed between the outer substrates and the inner substrate or substrates. For example, in FIG. 13, metal layers 1340 may be disposed between the first outer substrate 1330 and the inner substrate 1334 and between the inner substrate 1334 and the second outer substrate 1332. Vias 1360 can be used to electrically connect all of the metal layers.

Figure 13:
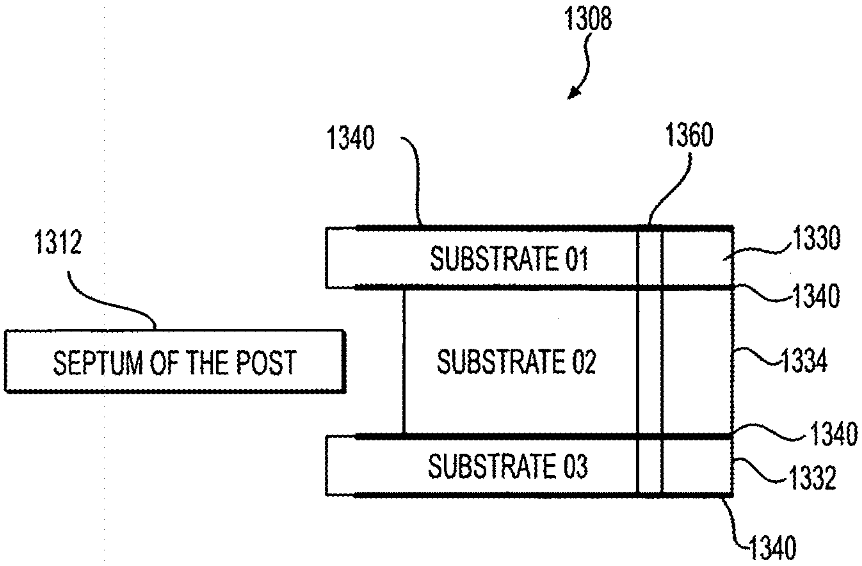
FIG. 13 is a diagram of the substrate layering of a dual-polarized phased array antenna according to certain embodiments.

In some embodiments, a single substrate material forms the central portion of the stack, for example as illustrated by layer 1334 in FIG. 13, and in other embodiments, multiple substrates are laminated together to form the required thickness. According to some embodiments, the radiating element is formed from five layers of substrates. The outer substrates form the portion of the radiating element that encapsulate the pillars. These outer layers may be plated on both sides with radiating ears. These outer layers with platings are bonded to a multi-layered central portion. The central portion is formed from three substrates. According to some embodiments, each of the central substrates includes a metal layer on each face. The substrates are bonded together and edge plated.

According to some embodiments, the thickness of each of the center substrates is at least 0.005 inches, at least 0.010 inches, at least 0.015 inches, or at least 0.025 inches. According to some embodiments, the thickness is less than 0.5 inches, less than 0.25 inches, less than 0.01 inches, or less than 0.005 inches. According to some embodiments, the thicknesses of the center substrates very from one to the next. According to some embodiments, the thickness of the outer substrates is at least 0.001 inches, at least 0.005 inches, at least 0.010 inches, at least 0.015 inches, or at least 0.025 inches. According to some embodiments, the thickness is less than 0.5 inches, less than 0.25 inches, less than 0.01 inches, or less than 0.005 inches. According to some embodiments, each layer is formed of the same type of substrate material. According to other embodiments, the layers are formed from varied substrate materials. According to some embodiments, the outer substrates are formed from a stiffer substrate material than the center substrates because the extended portions of the outer substrates are unsupported and may flex if formed of material that is not stiff enough. Examples of commercially available substrate material that may be used are FR4, RO3002, RO6002, RO5880 and/or RO5880LZ from Rogers Corporation.

In some embodiments, as illustrated in FIG. 12A, a hole or cutout is formed into the central portion between the ground ear and the signal ear. This hole or cutout may improve the impedance transformation of the radiating element. According to some embodiments, no cutout is formed between radiating element ears.

Both the ground ears and signals ears include stem portions that extend to the base of the radiating ear board stack. According to some embodiments, the stem portions of the ground ears terminate at the bottom of the radiating ear board stack such that when the board is inserted into the base plate, the stem portions of the ground ears are in electrical contact. According to some embodiments, the bottom edge of the board stack at the termination of the stem portions of the ground ears is edge plated to provide the electrical connection with the base plate.

According to some embodiments, the bottom portion of the board stack includes a projection for inserting the board into the base plate. The projection may fit into or couple with a connector for connecting a feed line (such as a coaxial connector, a stripline or microstrip feed line connector) in the base plate. According to some embodiments, stem portions of the signal ears wrap around the projection to electrically contact the connector.

Referring to FIG. 12C, capacitive coupling is achieved by maintaining a gap 1220 between a radiating element ear and its adjacent pillar, which creates interdigitated capacitance between the two opposing surfaces of gap 1220. The interdigitated capacitance created by gap 1220 can be used to improve the impedance matching of the radiating element.

Maximum capacitive coupling can be achieved by maximizing the surface area of gap 320 while minimizing the width of gap 320. According to certain embodiments, outer substrates 1230 and 1232 wrap around the cross shape of pillar 1212 in order to maximize the surface area. According to certain embodiments, gap 1220 is less than 0.1 inches, preferably less than 0.05 inches, and more preferably less than 0.01 inches. According to some embodiments, the gap spacing is different for different portions of the pillar. For example, the gap between the pillar and the center substrate 1234 (or substrates) may be greater than the gap between the overhanging outer substrates. For example, the center gap may be at least 0.005 inches, at least 0.01 inches, at least 0.02 inches, at least 0.05 inches, or at least 0.1 inches. Preferably the gap is at least 0.025 inches. The outer gap may be greater than or less than the center gap. According to some embodiments, the outer gap is at least 0.005 inches, at least 0.01 inches, at least 0.02 inches, at least 0.05 inches, or at least 0.1 inches. Preferably the outer gap is at least 0.014 inches.

According to some embodiments, the radiating elements (1208 and 1210) are edge plated such that metal wraps around the edges of outer layers and coats the edge of the inner substrate. In this way, the surfaces of the layered radiating elements that face the gap are metal. This can improve capacitive coupling between the radiating element and the pillar. According to some embodiments, the edges of the substrates are not edge plated and the metal layers may be trimmed some amount from the edge of the outer boards (for example, as shown in FIG. 13). This may help in preventing contact between the metallic pillar and the metal layers of the ears, which could interrupt the capacitive coupling. According to some embodiments, the metal portions are trimmed at least 0.001 inches, at least 0.005 inches, at least 0.01 inches, or at least 0.05 inches from the edge of the outer substrate.

According to certain embodiments, pillar 1312 may be formed from materials that are substantially conductive and that are relatively easily to machine, cast and/or solder or braze. For example, pillar 1312 may be formed from copper, aluminum, gold, silver, beryllium copper, or brass. In some embodiments, pillar 1312 may be substantially or completely solid. For example, pillar 1312 may be formed from a conductive material, for example, substantially solid copper, brass, gold, silver, beryllium copper, or aluminum. In other embodiments, pillar 1312 is substantially formed from non-conductive material, for example plastics such as ABS, Nylon, PA, PBT, PC, PEEK, PEK, PET, Polyimides, POM, PPS, PPO, PSU, PTFE, or UHMWPE, with their outer surfaces coated or plated with a suitable conductive material, such as copper, gold, silver, or nickel.

In other embodiments, pillar 1312 may be substantially or completely hollow, or have some combination of solid and hollow portions. For example, pillar 1312 may include a number of planar sheet cut-outs that are soldered, brazed, welded or otherwise held together to form a hollow three-dimensional structure. According to some embodiments, pillar 1312 is machined, molded, cast, or formed by wire-EDM. According to some embodiments, pillar 1312 is 3D printed, for example, from a conductive material or from a non-conductive material that is then coated or plated with a conductive material.

Base plate 1314 and pillar 1312 may be separate pieces that may be manufactured according to the methods described above. Pillar 1312 may be assembled to base plate 214 by welding or soldering onto base plate 1314. In some embodiments, pillar 1312 is press fit (interference fit) into a hole in base plate 1314. According to certain embodiments, pillar 1312 is screwed into base plate 1314. For example, male threads may be formed into the bottom portion of pillar 212 and female threads may be formed into the receiving hole in base plate 214. According to certain embodiments, pillar 212 is formed with a pin portion at its base that presses into a hole in base plate 214. According to certain embodiments, a bore is machined into pillar 212 at the base to accommodate an end of a pin and a matching bore is formed in base plate 214 to accommodate the other end of the pin. Then the pin is pressed into the pillar 212 or the base plate 214 and the pillar 212 is pressed onto the base plate 214. According to some embodiments, pillar 1312 is formed into the same block of material as base plate 1314.

Radiating Element

As described above, radiating elements (e.g., 410 of FIG. 4), according to certain embodiments, include pairs of radiating element ears, a ground ear (e.g., 418) and a signal ear (e.g., 416) formed into metal layers bonded to or formed into dielectric material. The design of the radiating elements affects the beam forming and steering characteristics of the phased array antenna. For example, as discussed above, the height of the radiating element may affect the operational frequency range. For example, the shortest wavelength (corresponding to the highest frequency) may be equivalent to twice the height of the radiating element. In addition to this design parameter, other features of the radiating element can affect bandwidth, cross-polarization, scan volume, and other antenna performance characteristics. According to the embodiment shown in FIG. 4, radiating element 410 includes a symmetrical portion that is symmetrical from just above the top of the stem portion 403 to the top of element 410 such that the upper portion of ground ear 418 is a mirror image of the upper portion of signal ear 416. Each ear includes a connecting portion for connecting to plug 428 and a comb portion 480. According to some embodiments, the signal ear includes stem portion 403, while the ground ear is connected to ground traces 415 on outer metal layers through vias 417. Each comb portion 480 includes an inner facing irregular surface 482 and an outward facing capacitive coupling portion 484 for coupling with the adjacent ground pillar (e.g., pillar 412).

An important design consideration in phased array antennas is the impedance matching of the radiating element. This impedance matching affects the achievable frequency bandwidth as well as the antenna gain. With poor impedance matching, bandwidth may be reduced and higher losses may occur resulting in reduced antenna gain.

As is known in the art, impedance refers, in the present context, to the ratio of the time-averaged value of voltage and current in a given section of the radiating elements. This ratio, and thus the impedance of each section, depends on the geometrical properties of the radiating element, such as, for example, element width, the spacing between the signal ear the ground ear, and the dielectric properties of the materials employed. If a radiating element is interconnected with a transmission line having different impedance, the difference in impedances ("impedance step" or "impedance mismatch") causes a partial reflection of a signal traveling through the transmission line and radiating element. The same can occur between the radiating element and free space. "Impedance matching" is a process for reducing or eliminating such partial signal reflections by matching the impedance of a section of the radiating element to the impedance of the adjoining transmission line or free space. As such, impedance matching establishes a condition for maximum power transfer at such junctions. "Impedance transformation" is a process of gradually transforming the impedance of the radiating element from a first matched impedance at one end (e.g., the transmission line connecting end) to a second matched impedance at the opposite end (e.g., the free space end).

According to certain embodiments, transmission feed lines provide the radiating elements of a phased array antenna with excitation signals. The transmission feed lines may be specialized cables designed to carry alternating current of radio frequency. In certain embodiments, the transmission feed lines may each have an impedance of 50 ohms. In certain embodiments, when the transmission feed lines are excited in-phase, the characteristic impedance of the transmission feed lines may also be 50 ohms. As understood by one of ordinary skill in the art, it is desirable to design a radiating element to perform impedance transformation from this 50 ohm impedance into the antenna at the connector, e.g., a connector embedded in base plate 414, to the impedance of free space, given by 120×pi (377) ohms. By designing the radiating element, base plate and connector to achieve this impedance transformation, the phased array antenna can be easily coupled to a control circuit without the need for intermediate impedance transformation components.

According to certain embodiments, instead of designing the phased array antenna for 50 ohm impedance into connector 530, the antenna is designed for another impedance into connector 530, such as 100 ohms, 150 ohms, 200 ohms, or 250 ohms, for example. According to certain embodiments, a radiating element is designed for impedance matching to some other value than free space (377 ohms), for example, when a radome is to be used.

According to certain embodiments, the radiating element is designed to have optimal impedance transfer from transmission feed line to free space. It will be appreciated by those of ordinary skill in the art, that the radiating element can have various shapes to effect the impedance transformation required to provide optimal impedance matching, as described above. The described embodiments can be modified using known methods to match the impedance of the fifty ohm feed to free space.

According to certain embodiments, the board of unit cell 402 interfaces with base plate 414 through a cutout 490 (e.g., a bore or a slot) in base plate 414. Embedded within base plate 414 may be a connector for interfacing with the signal ear stem portion 403 and, in some embodiments, with ground traces 415. The interface between the board and the base plate, and the connector within the base plate, according to some embodiments, can result in impedance at the base of the stem portion of the signal ear and the ground traces of the ground ear of about 150 ohms. According to some embodiments, this value is between 50 and 150 ohms and in other embodiments, this value is between 150 and 350 ohms. According to certain embodiments, the value is around 300 ohms. The shape of the stem and comb portions may be designed to perform the remaining impedance transformation (e.g., from 150 ohm to 377 ohm or from 300 ohm to 377 ohm).

Stem portion 403 of signal ear 416 and ground traces of ground ear 418, respectively, are parallel and spaced apart. According to certain embodiments, the distance between the stem portions is less than 0.5 inches, less than 0.1 inches, or less than 0.05. According to certain embodiments, the spacing is less than 0.025 inches.

The comb portion 480 of signal ear 416 includes inner-facing irregular surface 482 and the comb portion 480 of ground ear 418 includes inner-facing irregular surface 484. The inner-facing irregular surfaces 482 and 484 are symmetrical and include multiple lobes or projections. The placement and spacing of the lobes affects the impedance transformation of radiating element 410. According to the embodiment shown in FIG. 4B, these inner-facing surfaces curve away from the center line (e.g., center line 813 of FIG. 8) starting near the top of the stem portion 403 into first valleys and then curve toward the centerline into first lobes. The surfaces then curve away again into second valleys and curve toward the centerline again into final lobes. The sizes, shapes, and numbers of these lobes and valleys contribute to the impedance transformation of the radiating element. For example, according to certain embodiments, a radiating element ear includes only one lobe, for example, at the distal end (i.e., the inner-facing irregular surface has a "C" shaped profile).

According to other embodiments, a radiating element ear includes two lobes, four lobes, five lobes, or more. According to certain embodiments, instead of lobes, the radiating element ear includes comb-shaped teeth, saw-tooth shaped lobes, blocky lobes, or a regular wave pattern. According to some embodiments, ears of radiating elements have other shapes, for example they may be splines or straight lines. Straight line designs may be desirable if the antenna array is designed to operate only at a single frequency (for example, when the frequency spectrum is polluted at other frequencies). As appreciated by one of ordinary skill in the art, various techniques can be used to simulate the impedance transformation of radiating elements in order to tailor the shapes of the inner-facing irregular surfaces to the impedance transformation requirements for a given phased array antenna design.

According to certain embodiments, radiating element 410 can be designed with certain dimension to operate in a radio frequency band from 3 to 22 GHz. For example, radiating element 410 may be between 0.5 inches and 0.3 inches tall (preferably between 0.45 inches and 0.35 inches tall) from the top of base plate 414 to the top of radiating element 410. Stem portion 403 may be between than 0.5 inches and 0.1 inches tall and preferably between 0.2 inches and 0.25 inches tall. Comb portions 480 may be between 0.1 and 0.3 inches tall and preferably between 0.15 and 0.2 inches tall. According to certain embodiments, the distance from the outer edge of the capacitive coupling portion 484 of signal ear 416 to the outer edge of the capacitive coupling portion 484 of ground ear 418 may be between 0.15 inches and 0.30 inches and preferably between 0.2 and 0.25 inches. According to certain embodiments, these values are scaled up or down for a desired frequency bandwidth. For example, radiating elements designed for lower frequencies are scaled up (larger dimensions) and radiating elements designed for higher frequencies are scaled down (smaller dimensions).

Performance

Embodiments of phased array antennas described herein may exhibit superior performance over existing phased array antennas. For example, embodiments may exhibit large bandwidth, high scan volume, low cross polarization, and low average voltage standing wave ratio (VSWR), with small aperture and low cost.

According to certain embodiments, the phased array antenna is able to achieve greater than 5:1 bandwidth ratio, where the bandwidth ratio is the ratio of the frequency to the lowest frequency at which VSWR is less than 3:1 throughout the scan volume. Some embodiment may achieve greater than 6:1 bandwidth ratio or greater than 6.5:1 bandwidth ratio. Certain embodiments may achieve greater than 6.6:1 bandwidth ratio. According to certain embodiments, the phased array antenna is capable of achieving a frequency range from 2 to 30 GHz, where the frequency range is defined as the range of frequencies at which VSWR is less than 3:1 throughout the scan volume. Certain embodiment may achieve 3 to 25 GHz and certain embodiments may achieve 3.5 to 21.2 GHz. Certain embodiment may achieve ranges of, e.g., 1 to 30 GHz, 2 to 30 GHz, 3 to 25 GHz, and 3.5 to 21.5 GHz. According to certain embodiments, the phased array antenna can operate at a frequency of at least 1 GHz, at least 2 GHz, at least 3 GHz, at least 5 GHz, at least 10 GHz, at least 15 GHz, or at least 20 GHz. According to certain embodiments, the phased array antenna is designed to operate at a frequency of less than 50 GHz, less than 40 GHz, less than 30 GHz, less than 25 GHz, less than 22 GHz, less than 20 GHz, or less than 15 GHz.

Phased array antennas according to certain embodiments can achieve high scan volume. The capacitive coupling of the radiating elements as well as the radiating element spacing, according to certain embodiments, can result in increased scan volume due to the reduction in grating lobes. Certain embodiments can have a scan volume of at least at least 30 degrees from broadside over full azimuth. In other words, the beam can be steered in a range of angles from 0 degrees (broadside) to at least 30 degrees from broadside over the full azimuth (in any direction on a plane parallel to the array plane) without producing grating lobes. Certain embodiments can have a scan volume of at least at least 45 degrees from broadside over full azimuth. Certain embodiments can have a scan volume of at least at least 60 degrees from broadside over full azimuth.

According to certain embodiments, the phased array antenna has low VSWR characteristics. VSWR measures how well an antenna is impedance matched to the transmission line to which it is connected (for example, using a Vector Network Analyzer, such as the Agilent 8510 VNA, according to known methods). The lower the VSWR, the better the antenna is matched to the transmission line and the more power is delivered to the antenna. Low VSWR is important in maximizing the gain of the antenna array, which can result in fewer required radiating elements, which results in reduced aperture, lower weight, and lower cost. According to certain embodiments, the average VSWR (statistical mean of VSWR values at some frequency) is below 5:1, below 3:1, or below 2.5:1. According to certain embodiments, the average VSWR is below 2.5:1 for plus or minus 45 degrees from broadside over full azimuth. According to certain embodiments, the average VSWR is below 1.8:1 for plus or minus 45 degrees from broadside over full azimuth. According to certain embodiments, the average VSWR is below 1.5:1 for plus or minus 45 degrees from broadside over full azimuth. According to some embodiments, the average VSWR is below 5:1, below 3:1, below 2.5:1, or below 1.5:1 for plus or minus 45 degrees from broadside over full azimuth over a frequency range of, e.g., 1 to 30 GHz, 2 to 30 GHz, 3 to 25 GHz, and 3.5 to 21.5 GHz.

Figure 14B:
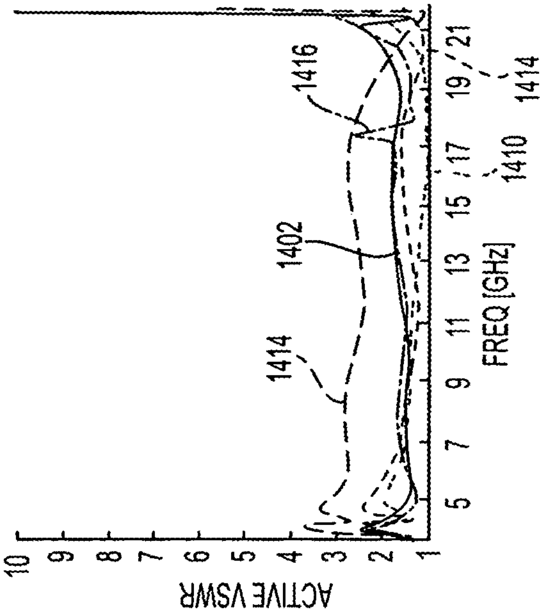
FIG. 14B is a plot of the VSWR behavior along different planes of a phased array antenna according to certain embodiments.
Figure 14A:
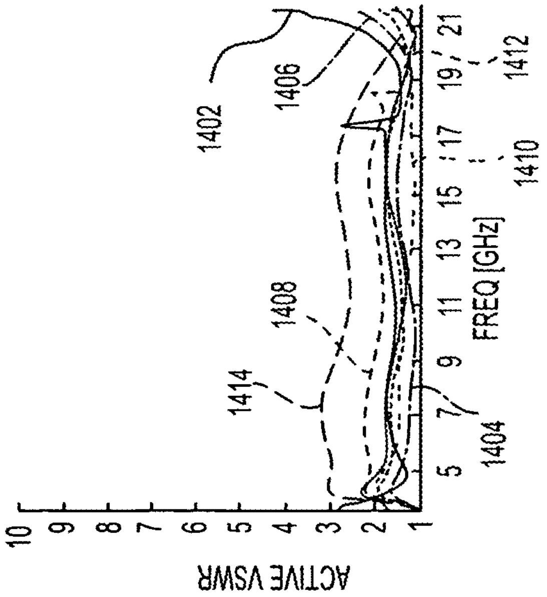
FIG. 14A is a plot of the VSWR behavior along different planes of a phased array antenna according to certain embodiments.

The VSWR across the operational frequency of a phased array antenna according to certain embodiments is plotted in FIGS. 14A and 14B. The measurements from several scan points are plotted across the operational frequency. For example, line 1402 shows the performance at broadside. Line 1404 shows 45 degrees from broadside on the x-z plane, line 1406 shows 45 degrees from broadside on the x-y plane, and line 1408 shows 45 degrees from broadside on the y-z plane. Lines 1410, 1412, and 1414 show 60 degrees from broadside on the x-z, x-y, and y-z planes, respectively. The average VSWR across the frequency range from 2.5 GHz to 21.2 GHz is 1.72 at broadside, 1.72 at 45 degrees from broadside on the x-z plane, and 2.29 at 45 degrees from broadside on the y-z plane. According to certain embodiments, the shape of the inner-facing surfaces of the radiating elements controls the positions of the peaks and valleys plotted in FIGS. 14A and 14B.

In accordance with the foregoing, frequency scaled ultra-wide spectrum phased array antennas can provide wide bandwidth, wide scan angle, and good polarization, in a low loss, lightweight, low profile design that is easy to manufacture. The unit cells may be scalable and may be combined into an array of any dimension to meet desired antenna performance.

Phased array antennas, according to some embodiments, may reduce the number of antennas which need to be implemented a given application by providing a single antenna that serves multiple systems. In reducing the number of required antennas, embodiments of the present invention may provide a smaller size, lighter weight alternative to conventional, multiple-antenna systems resulting in lower cost, less overall weight, and reduce aperture.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

What is claimed as new and desired to be protected by Letters Patent of the United States is:

1. A unit cell of for a phased array antenna comprising:
- a base plate;
- a first dielectric layer projecting from the base plate; and
- a first conductive layer disposed on a side of the first dielectric layer, the first conductive layer comprising:
  - a ground pillar;
  - a first ground member spaced apart from a first edge of the ground pillar; and
  - a first signal member disposed between the ground pillar and the first ground member, wherein:
- the first signal member is electrically insulated from the ground pillar and the first ground member, and
- an edge of the first signal member is configured to capacitively couple to the first edge of the ground pillar.

2. The unit cell of claim 1, wherein the conductive layer further comprises a second ground member spaced apart from a second edge of the ground pillar, opposite the first edge, wherein an edge of the second ground member is configured to capacitively couple to the second edge of the ground pillar.

3. The unit cell of claim 1, further comprising:
- a second dielectric layer;
- a second conductive layer disposed on a side of the second dielectric layer, the second conductive layer comprising:

a second signal member spaced apart from a third edge of the ground pillar, wherein the second signal member is electrically insulated from the base plate and the ground pillar, and an edge of the second signal member is configured to capacitively couple to the third edge of the ground pillar; and a third ground member spaced apart from a fourth edge of the ground pillar, opposite the third edge, wherein an edge of the third ground member is configured to capacitively couple to the fourth edge of the ground pillar.

4. The unit cell of claim 1, wherein the element is configured to receive RF signals in a frequency range between a first frequency and a second frequency that is higher than the first frequency and the first signal member projects from the base plate with a maximum height of one-half the wavelength of the second frequency.

5. The unit cell of claim 1, wherein:

the ground pillar comprises a first plurality of projections that project from the first edge of the ground pillar; and the first signal member comprises a second plurality of projections that project from the edge of the first signal member.

6. The unit cell of claim 1, wherein the ground pillar and the first ground member are electrically connected to the base plate.

7. The unit cell of claim 1, wherein a distal end of the first ground member and a distal end of the first signal member are substantially symmetrical about a plane disposed midway between the first ground member and the first signal member.

* * * * *